United States Patent
Park et al.

(10) Patent No.: US 7,429,816 B2
(45) Date of Patent: Sep. 30, 2008

(54) PIEZOELECTRIC VIBRATOR AND FABRICATING METHOD THEREOF

(75) Inventors: In-Kil Park, Gyeonggi-do (KR); Duk Hee Kim, Gyeonggi-do (KR)

(73) Assignee: Innochips Technology, Siheung (KR)

( * ) Notice: Subject to any disclaimer, the term of this patent is extended or adjusted under 35 U.S.C. 154(b) by 312 days.

(21) Appl. No.: 10/529,033

(22) PCT Filed: Sep. 26, 2003

(86) PCT No.: PCT/KR03/01965

§ 371 (c)(1),
(2), (4) Date: Mar. 23, 2005

(87) PCT Pub. No.: WO2004/030113

PCT Pub. Date: Apr. 8, 2004

(65) Prior Publication Data

US 2006/0163974 A1    Jul. 27, 2006

(30) Foreign Application Priority Data

Sep. 27, 2002 (KR) .............. 10-2002-0058673
Jan. 22, 2003 (KR) .............. 10-2003-0004415

(51) Int. Cl.
*H01L 41/08* (2006.01)
*H03H 9/17* (2006.01)
*H03H 9/19* (2006.01)

(52) U.S. Cl. ............... 310/348; 310/320; 310/324; 310/365

(58) Field of Classification Search ......... 310/320, 310/324, 365, 348
See application file for complete search history.

(56) References Cited

U.S. PATENT DOCUMENTS

| 5,527,501 | A | | 6/1996 | Sawada et al. |
| 6,163,101 | A | * | 12/2000 | Yoshida et al. .............. 310/348 |
| 6,201,337 | B1 | | 3/2001 | Kaida et al. |
| 6,232,699 | B1 | * | 5/2001 | Wajima ...................... 310/320 |
| 6,373,169 | B1 | * | 4/2002 | Wajima ...................... 310/320 |
| 6,987,347 | B2 | * | 1/2006 | Yoshio et al. ............... 310/320 |
| 6,992,420 | B2 | * | 1/2006 | Jang et al. .................. 310/324 |
| 7,154,212 | B1 | * | 12/2006 | Kosinski .................... 310/348 |
| 2002/0135274 | A1 | | 9/2002 | Wajima et al. |
| 2004/0251779 | A1 | * | 12/2004 | Yoshio et al. ............... 310/320 |
| 2007/0044296 | A1 | * | 3/2007 | Jeon et al. ................... 29/594 |

FOREIGN PATENT DOCUMENTS

CN    1303173     7/2001
JP    59172821    9/1984

(Continued)

*Primary Examiner*—Jaydi A San Martin
(74) *Attorney, Agent, or Firm*—Marger Johnson & McCollom PC

(57) ABSTRACT

The present invention relates to piezoelectric vibrators such as a resonator used as a timing element, discriminator, filter or the like, and fabricating methods thereof. The piezoelectric vibrators of the present invention may be fabricated by forming a piezoelectric body of piezoelectric sheets, of which the thickness is controlled, and simultaneously sintering the sheets along with cover layers, on which grooves are formed. Also, the piezoelectric vibrator of the present invention is fabricated by laminating the piezoelectric sheets, of which the thickness is controlled, providing internal electrodes between the sheets, and forming external electrodes insulated from the internal electrodes.

8 Claims, 13 Drawing Sheets

FOREIGN PATENT DOCUMENTS

| | | |
|---|---|---|
| JP | 01-158810 | 6/1989 |
| JP | 3265204 | 11/1991 |
| JP | 6224677 | 8/1994 |
| JP | 2536663 | 7/1996 |
| JP | 9270540 | 10/1997 |
| JP | 11068187 | 3/1999 |
| JP | 2000-295063 | 10/2000 |
| JP | 2002314160 | 10/2002 |

* cited by examiner

PIEZOELECTRIC VIBRATOR AND FABRICATING METHOD THEREOF

BACKGROUND OF THE INVENTION

1. Field of the Invention

The present invention relates to piezoelectric vibrators such as a resonator used as a timing element, discriminator, filter or the like, and fabricating methods thereof. The present invention relates particularly to a laminated piezoelectric vibrator that is compact and has high and stable oscillating frequency, and fabricating methods thereof.

2. Description of the Related Art

A reference clock for the IC is required in order to utilize an integrated circuit (IC) which is a major element of various electronic devices. According to the development of IC technology, the various electronic devices are particularly controlled by single large scale integration (LSI) circuits, such as one-chip microprocessors. Most microprocessors have used ceramic resonator as a timing element. Since a ceramic resonator is stable, non-tunable and compact and is fabricated with low costs, its application is gradually becoming wide.

Lately, as performance and speed of the electronic devices is improved, it is required that oscillating frequency of resonators increases. Thus, it is required that the resonator to be developed hereafter has higher oscillating frequency to generate stable oscillation. Compact resonators are also required as the electronic devices become compact.

However, as shown in FIG. 1, a conventional ceramic resonator comprises a single plate type ceramic piezoelectric body 101 polished to have the thickness corresponding to desired frequency after sintering it, electrodes 102 formed on the upper and lower surfaces of the piezoelectric body 101 by thin film forming process, insulating cover layers 103 in which vibration grooves 104 are formed, and external electrodes 105 formed outside the piezoelectric body and cover layers. In such a case, the electrodes 102 are formed with various shapes so that energy trap occurs. The fabricating method of the conventional ceramic resonator is shown in FIG. 2. First, the piezoelectric body 101 is fabricated by pressing and molding ceramic powder for a piezoelectric body into quadrangle using general powder molding methods. The piezoelectric green body is sintered, cut with a dicing saw, and polished until it has thickness corresponding to desired frequency. On the piezoelectric body 101 processed to have the proper thickness, the electrodes 102 are formed by sputtering. Then, polling process of the piezoelectric body is performed. The polling process, which gives the ceramic piezoelectric body piezoelectricity, causes electric dipole to be oriented to one direction by applying electric field to the electrodes of the ceramic piezoelectric body. As shown in FIG. 2(b), the cover layers 103, in which the vibration grooves 104 are formed, are bonded to the upper and lower portions of the piezoelectric body, on which the electrodes are formed, by using epoxy 110. The cover layers are fabricated by sintering a green body that is formed of piezoelectric or dielectric ceramic powder by the general powder molding method. In such a case, the cover layer is formed with the mold, which is designed so that the vibration groove is formed on the cover layer as shown in the drawing. After the piezoelectric body and the upper and lower cover layers are bonded, a unit chip element 106 is obtained by cutting the bonded body as shown in FIG. 2(c). The external electrodes 105, each of which is connected to each of the electrodes 102 formed in the unit chip element 106, are formed outside the chip element as shown in FIG. 2(d). FIG. 1 is a cross-sectional view showing the chip element taken along the cross-sectional plane I-I. Then, the ceramic resonator is completed by epoxy molding or SMD (Surface Mount Device) packaging the chip element. Since an oscillating frequency in a resonator having MHz band is inversely proportional to its thickness in order to increase the oscillating frequency, the thickness of the piezoelectric body must be thin. Thus, in order for a single plate type piezoelectric resonator to have high oscillating frequency, the thickness of the piezoelectric body must continuously decrease by polishing. However, since there are many problems in practical manufacturing process, such as difficulty in polishing piezoelectric body plate uniformly over its entire surface, and breakage in handling, the conventional method is faced with the limitation to fabricating a resonator with high frequency. Accordingly, the production rate decreases and the production cost increases.

For the reasons, a higher harmonic vibration resonator, which utilizes high order vibration of a single plate type piezoelectric body, has been developed.

A general filter having MHz band uses energy trap due to a thickness vibration or thickness shearing vibration. If electrodes are formed on the entire surface of a piezoelectric substrate, it is difficult to obtain excellent resonance characteristics from combination with higher harmonic vibration of profile vibration. However, if the electrodes are formed partially on the surface of the piezoelectric substrate, there are boundaries between the portion in which the electrodes exist and the portion in which the electrodes do not exist. Since standing wave of the vibration occurs in the electrode portion near the boundaries, energy trap, which captures vibration energy, also occurs. The energy trap provides independent resonance characteristics although plural electrodes are formed on a substrate at intervals of predetermined or above space. In the case that the energy trap is used, the thickness shear vibration is utilized within the frequency range of 2 to 8 MHz, while thickness vibration is utilized within the frequency range of 8 to 16 MHz. However, since practical applications such as a mobile communication terminal, CD-ROM, HDD, and the like require high frequency of over 20 MHz, the resonator using third and fifth order vibrations of the thickness vibration has been utilized. That is, the higher harmonic vibration of wavelength 2L/n (n=integer) including a fundamental wave of wavelength 2L occurs in a piezoelectric substrate of thickness L. Since the vibrations wherein the n is an even number are cancelled by each other, the only vibrations wherein the n is an odd number appear. That is, the vibrations of third order, fifth order, seventh order, or the like including the fundamental wave occur. Resonance frequencies of the higher harmonic vibrations occur at an integer multiple of the fundamental wave $f_1$. For example, the third order vibration and fifth order vibration are expressed as $f_3=3f_1$ and $f_5=5f_1$, respectively.

That is, a piezoelectric body oscillates with the fundamental vibration wherein the thickness of the piezoelectric body is half wavelength and the vibrations corresponding to odd multiples, such as three multiple, five multiple, seven multiple, or the like, of the fundamental vibration. Using the higher harmonic vibration, a resonator having more 16 MHz is realized. However, since the resonator using the higher harmonic vibration has small amplitude, driving voltage for oscillating becomes higher and frequency jump due to the oscillation in fundamental vibration occurs.

Also, even if the higher harmonic vibrations of over third order are used, since the thickness of the piezoelectric body must be thin in order to obtain the oscillating frequency of over 50 MHz, processibility or workability deteriorates. Thus, it is difficult to fabricate piezoelectric elements.

SUMMARY OF THE INVENTION

It is an object of the present invention to solve the above problems by means of a piezoelectric vibrator, which has desired oscillating frequency and stable oscillating characteristics as well as is thin and compact with workability, and fabricating method thereof.

It is another object of the present invention to increase the production rate and decrease the production costs by the fabricating process that is simplified and has excellent workability and improved processibility to fabricate piezoelectric vibrators with various configurations.

It is a further object of the present invention to provide a stable, integrated, combined chip, which minimizes unit chips and obtains desired oscillating characteristics from a single chip by fabricating a capacitor, which is required for oscillation of a vibrator, into the vibrator of the single chip.

The piezoelectric vibrator of the present invention for achieving the objects may be fabricated by forming a piezoelectric body of piezoelectric sheets, of which the thickness is controlled, and simultaneously sintering the sheets along with cover layers, on which grooves are formed. Also, the piezoelectric vibrator of the present invention is fabricated by laminating the piezoelectric sheets, of which the thickness is controlled, providing internal electrodes between the sheets, and forming external electrodes insulated from the internal electrodes.

More concretely, a piezoelectric vibrator of the present invention for achieving the objects comprises a piezoelectric sheet; internal electrodes formed on the upper and lower portions of the piezoelectric sheet; cover layers, wherein one of the cover layers is formed on each of the upper and lower portions of the piezoelectric sheet on which the internal electrodes are formed; and external electrodes, each of which is connected to each of the internal electrodes; wherein the cover layers formed on the piezoelectric sheet are provided with vibration grooves, the piezoelectric sheet is fabricated by forming a sheet of slurry, and the vibrator is fabricated by simultaneously sintering the piezoelectric sheet and the cover layers. In such a case, the vibration grooves may be provided between the piezoelectric sheet and cover layers.

The cover layer may comprise a first cover layer where a through-hole is formed and a second cover layer, which covers the through-hole. The vibrator may further comprise first and second surface external electrodes, which are formed on a surface of the cover layer, and each of which is connected to each of the external electrodes, and a third surface external electrode, which is formed in the middle of the surface of the cover layer, and which is not connected to the external electrodes, wherein the extreme outer cover layers of the vibrator are dielectrics. The vibrator may further comprise at least one dielectric sheet, in which internal electrodes are formed, wherein the dielectric sheet is laminated and combined on the upper portion and/or the lower portion of the vibrator. In such a case, the vibrator is three-terminal type, that is, the external electrodes are connected to the internal electrodes of a piezoelectric portion and a capacitor portion in both ends and in the middle of the vibrator, respectively.

A method for fabricating a vibrator of the present invention for achieving the objects comprises steps of fabricating plural piezoelectric green sheets of slurry having desired composition; forming first upper and lower cover layers by forming through-holes in predetermined sheets of the green sheets; providing predetermined sheets of the green sheets as a vibration active sheet and second upper and lower cover layers; forming an upper internal electrode between the vibration active sheet and the first upper cover layer and a lower internal electrode between the vibration active sheet and the first lower cover layer; laminating the first upper and lower cover layers on the upper and lower portions of the vibration active sheet, respectively, and laminating the second upper and lower cover layers on the upper and lower portions of the first upper and lower cover layers, respectively; simultaneously sintering the laminate; and forming external electrodes, each of which is connected to each of the internal electrodes, on the laminate.

The step of forming the first upper and lower cover layers may comprise a step of filling at least one through-hole of the first upper and lower cover layers with organic paste, and the step of simultaneously sintering the laminate comprises a step of removing the organic matter by heat treatment. The step of forming the internal electrodes may comprise a step of printing the upper and lower internal electrodes on the upper and lower surfaces of the vibration active sheet. In such a case, the step of forming the lower internal electrode may comprise a step of printing the lower internal electrode on the first lower cover layer which is filled with the organic paste.

A method for fabricating a vibrator of the present invention for achieving the objects comprises steps of fabricating plural piezoelectric green sheets of slurry having desired composition; forming a lower cover layer by printing a vibration groove organic pattern on a predetermined sheet of the green sheets with organic paste and forming a lower internal electrode thereon; forming a vibration active sheet by forming an upper internal electrode on a predetermined sheet of the green sheets and forming a vibration groove organic pattern thereon; providing a predetermined sheet of the green sheets as an upper cover layer; laminating the lower cover layer, the vibration active sheet, and the upper cover layer in the order thereof; forming the vibration grooves by heat treating the laminate to remove the organic matter and simultaneously sintering the laminate; and forming external electrodes, each of which is connected to each of the internal electrodes, on the laminate.

The cover layers may comprise through-holes for burning passages through which the organic matter is communicated with an environment. The internal electrodes and external electrodes may be formed by using thick film deposition, such as screen printing, or thin film deposition, such as sputtering, evaporation, chemical vapor deposition, or sol-gel coating.

A vibrator of the present invention for achieving the objects comprises internal electrodes, which are not connected to external electrodes of the vibrator by controlling the pattern of internal electrodes in the vibrator.

A vibrator of the present invention for achieving the objects comprises a laminated element of at least two piezoelectric sheets; internal electrodes formed between the laminated piezoelectric sheets; and external electrodes formed outside the laminated element; wherein the internal electrodes are not connected to the external electrodes by controlling patterns of the internal electrodes.

Each of the external electrodes may be formed on each pf the upper, lower and side portions of the laminated element. The vibrator may further comprise insulators one the upper and lower portions of the laminated element, wherein a vibration groove is formed on the insulator. The vibrator may further comprises conductive passages, which pass through the laminated element and are not connected to the internal electrode, and each of which is connected to each of the external electrodes. The vibrator may further comprise three-terminal electrodes provided on a surface of the insulator on which the vibration groove is formed, wherein the insulators comprising dielectrics function as capacitors. The vibrator may comprises at least one dielectric bonded to the laminated piezoelectric element. In such a case, the dielectric is a laminated or single plate type. A dielectric substrate, which functions as a capacitor with terminals, may be installed on the lower portion of the laminated element, and a protective cap for protecting elements is installed on the upper portion of the laminated element. Also, an insulating substrate where external terminals are formed is installed on the lower portion of the laminate element, and a protective cap for protecting elements may be installed on the upper portion of the laminated element. The laminated element and the insulators may be green with epoxy for protecting elements.

A method for fabricating a vibrator of the present invention for achieving the objects comprises steps of fabricating piezoelectric green sheets of slurry having desired composition; forming internal electrodes, which are not connected to external electrodes, on the green sheets; laminating at least two of the sheets on which the internal electrodes are formed; sintering the laminate; and forming external electrodes, which are not connected to the internal electrodes, outside the laminate.

A method for fabricating a vibrator of the present invention for achieving the objects comprises steps of fabricating piezoelectric green sheets of slurry having desired composition; forming through-holes at both ends of the green sheets; forming internal electrodes on the green sheets so that the internal electrodes do not come into contact with the through-holes and are not connected to the external electrodes while the through-holes are filled with conductive paste; laminating at least two of the sheets; sintering the laminate; and forming external electrodes, which are not connected to the internal electrodes and are connected to the conductive paste of the through-holes, outside the laminate.

The internal electrodes may be formed on a partial or near complete surface of the sheets so that the internal electrodes are spaced from the edges of the sheets. The internal electrodes and external electrodes are formed by using thick film deposition, such as screen printing, or thin film deposition, such as sputtering, evaporation, chemical vapor deposition, or sol-gel coating.

DETAILED DESCRIPTION OF PREFERRED EMBODIMENTS

A resonator, as an example of a vibrator according to the present invention, and a fabricating method thereof will be explained below in detail.

Embodiment 1

Figure 3:
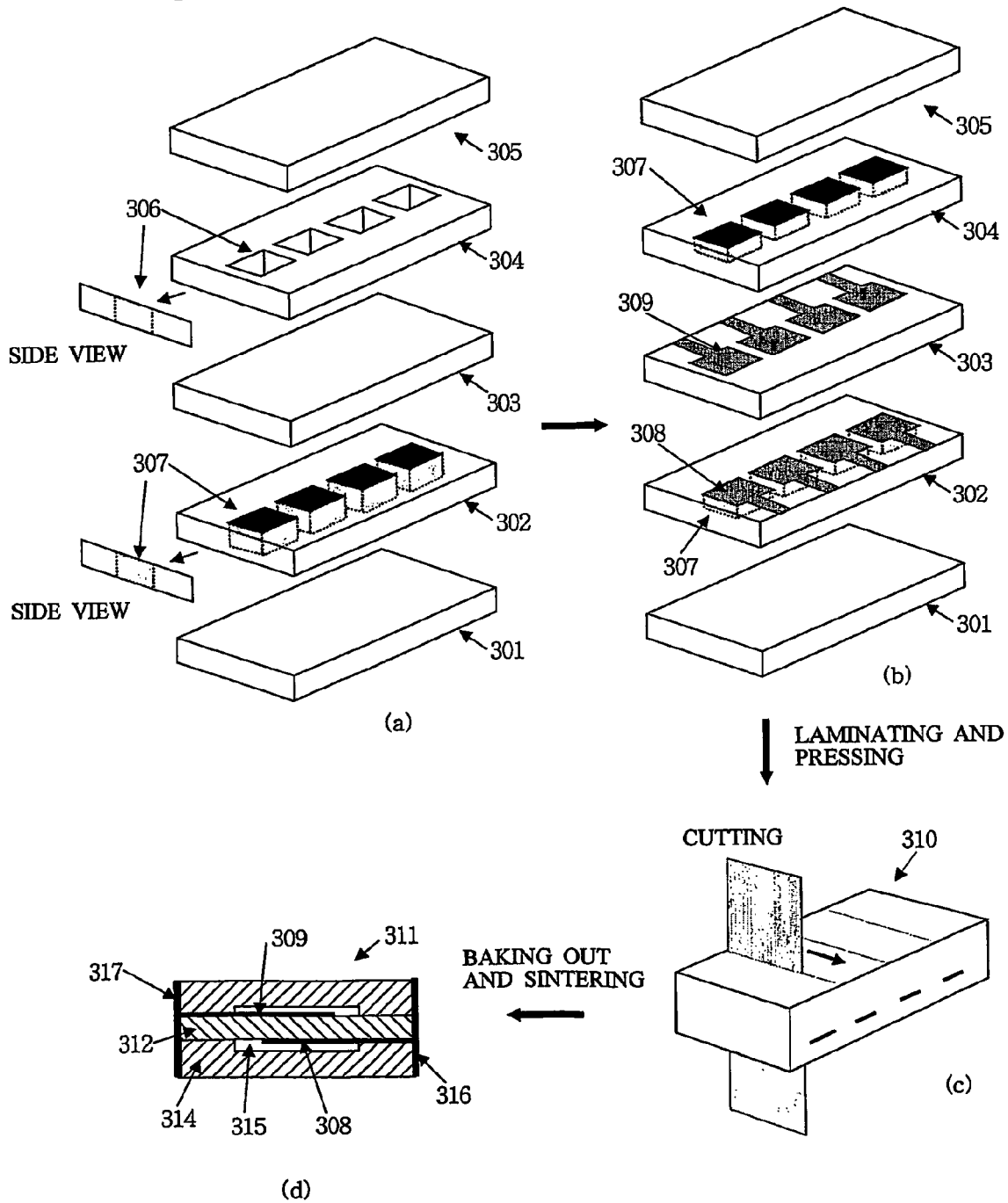
FIG. 3a-3b is an explanatory view of a fabricating process of a resonator according to Embodiment 1.

Referring to FIG. 3, a fabricating process of a through-hole type resonator according to the present invention will be explained in detail.

Raw material powder of a piezoelectric vibrator, which is available for industrial use, is used. Otherwise, the raw material powder of desired piezoelectric composition such as PZT, PLZT, or the like is provided. In order to prepare green sheets, slurry is produced by stirring and mixing the piezoelectric body ceramic powder provided as above with alcohol and PVB-based binder as additional agents and milling it for about 24 hours with a ball mill. Plural piezoelectric green sheets (301 to 305) having a desired thickness are fabricated of the slurry by using a tape casting, a doctor blade, or the like. In such a case, the thickness of the piezoelectric green sheets is controlled by adjusting slurry state such as viscosity, various parameters in doctor blade, or the like.

Plural through-holes 306 are formed in the sheets 302, 304 among the sheets fabricated as above with a punching machine. The plural through-holes 306 may be in various shapes, such as rectangle, circle and oval. The plural through-holes 306 are positioned so that they are aligned with internal electrodes of the vibrator. The first upper and lower cover layers 302, 304 are fabricated by filling the through-holes 306 with paste 307, such as carbon paste or PVB- or PVA-based organic paste which can be baked out, using screen printing. The through holes are filled in order to prevent the through-holes from being collapsed when the green sheets are pressed after they are laminated and before they are cut. The first lower cover layer is completed by forming lower internal electrodes 308 for the vibrator on the sheet 302 of the sheets, of which the through-hole is filled with the paste, at predetermined positions with which the through-holes in the sheet 302 are aligned, wherein the lower internal electrodes 308 may be metal electrodes Ag, Pt, or the like formed by using thick film deposition, such as screen printing, or thin film deposition, such as sputtering, evaporation, chemical vapor deposition, or sol-gel coating. A vibration active sheet is fabricated by forming upper internal electrodes 309 for the vibrator on the piezoelectric sheet 303, in which the through-holes are not formed, and of which the thickness is controlled up to tens micrometers, at predetermined positions of the piezoelectric sheet 303 corresponding to the lower internal electrodes, wherein the upper internal electrodes 309 may be metal electrodes of Ag, Pt, or the like formed by sputtering, or may be printed with conductive paste by screen printing.

In addition to fabricating the first upper and lower cover layers 304, 302 by filling the through-hole with the organic paste as above, the first upper and lower cover layers 304, 302 may be simply fabricated without the organic paste. That is, the first upper and lower cover layers are fabricated by forming the plural through-holes in the sheets. The upper and lower internal electrodes are formed on the upper and lower surfaces of the piezoelectric sheet, in which the through-holes are not formed, and of which the thickness is controlled. The upper and lower internal electrodes are formed so that they are aligned with the through-holes. Otherwise, the first upper and lower cover layers 304, 302 may be fabricated by filling the through-holes in any one of the first upper and lower cover layers 304, 302 with the organic paste. For example, the first lower cover layer may be fabricated by filling only the through-holes of the first lower cover layer 302 with the organic paste and forming the lower internal electrodes 308 for the vibrator.

A green bar 310, which contains plural unit chips, is fabricated by laminating the sheets fabricated as above in the order of the second lower cover layer 301, the first lower cover layer 302, the vibration active sheet 303, the first upper cover layer 304, and the second upper cover layer 305.

The green bar 310 is pressed and cut into the unit chips 311. In order to remove the binder and organic matter of every kind in the sheets and the through-holes by burning the unit chip, the unit chip is baked out by heating it at below 300° C. Then, the piezoelectric element 311 is completed by simultaneously sintering the vibration sheet and cover layers at a temperature for sintering the piezoelectric composition by increasing temperature. The organic matter in the through-holes of the upper and lower cover layers as well as the sheets are burned and removed, so that vibration grooves 315 for vibration of the vibrator are formed.

Figure 1:
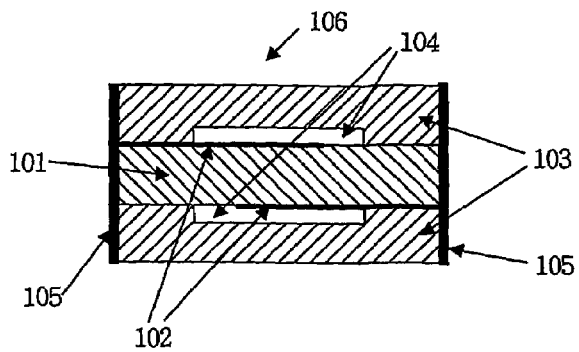
FIG. 1 is a cross sectional view of a general single plate type resonator.
Figure 2:
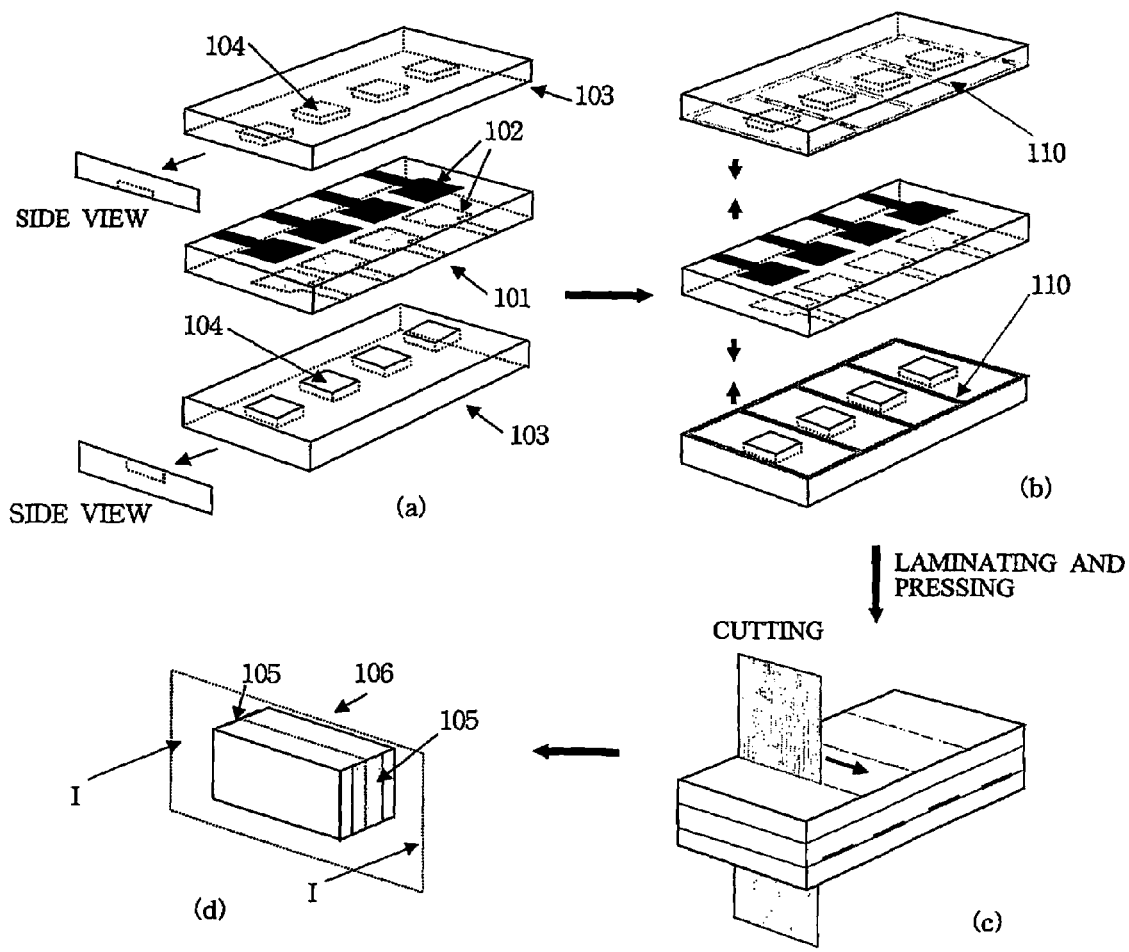
FIG. 2a-2b is an explanatory view of a fabricating process of the general single plate type resonator.

The piezoelectric vibrator is completed by forming external electrodes 316, 317 on both ends of the piezoelectric element 311 sintered and fabricated as above so that the external electrodes are connected to the internal electrodes 308, 309, respectively, and by performing polling process, which causes the electric dipole to be oriented to one direction by the applying electric field in order to give the piezoelectricity. FIG. 3(d) is a cross-sectional view of the completed piezoelectric vibrator, wherein the cross-sectional plane thereof is similar to that shown in FIG. 2(d).

The resonator fabricated as above can achieve a high oscillating frequency corresponding to the thickness of the thin piezoelectric sheet since the internal electrodes 308, 309 are formed on the upper and lower surfaces of the thin piezoelectric sheet 312, of which the thickness is controlled so that the desired thickness is achieved without a additional process such as polishing by fabricating the piezoelectric body of the sheets. Further, since the element is obtained by laminating the piezoelectric sheet and the cover layers and simultaneously sintering them, workability is improved and the process is simplified. Thus, the elements with various configurations are fabricated easily.

In the present embodiment, desired frequency characteristics are variously obtained by controlling the laminating number of the thin piezoelectric sheets 303.

Embodiment 2

Figure 4:
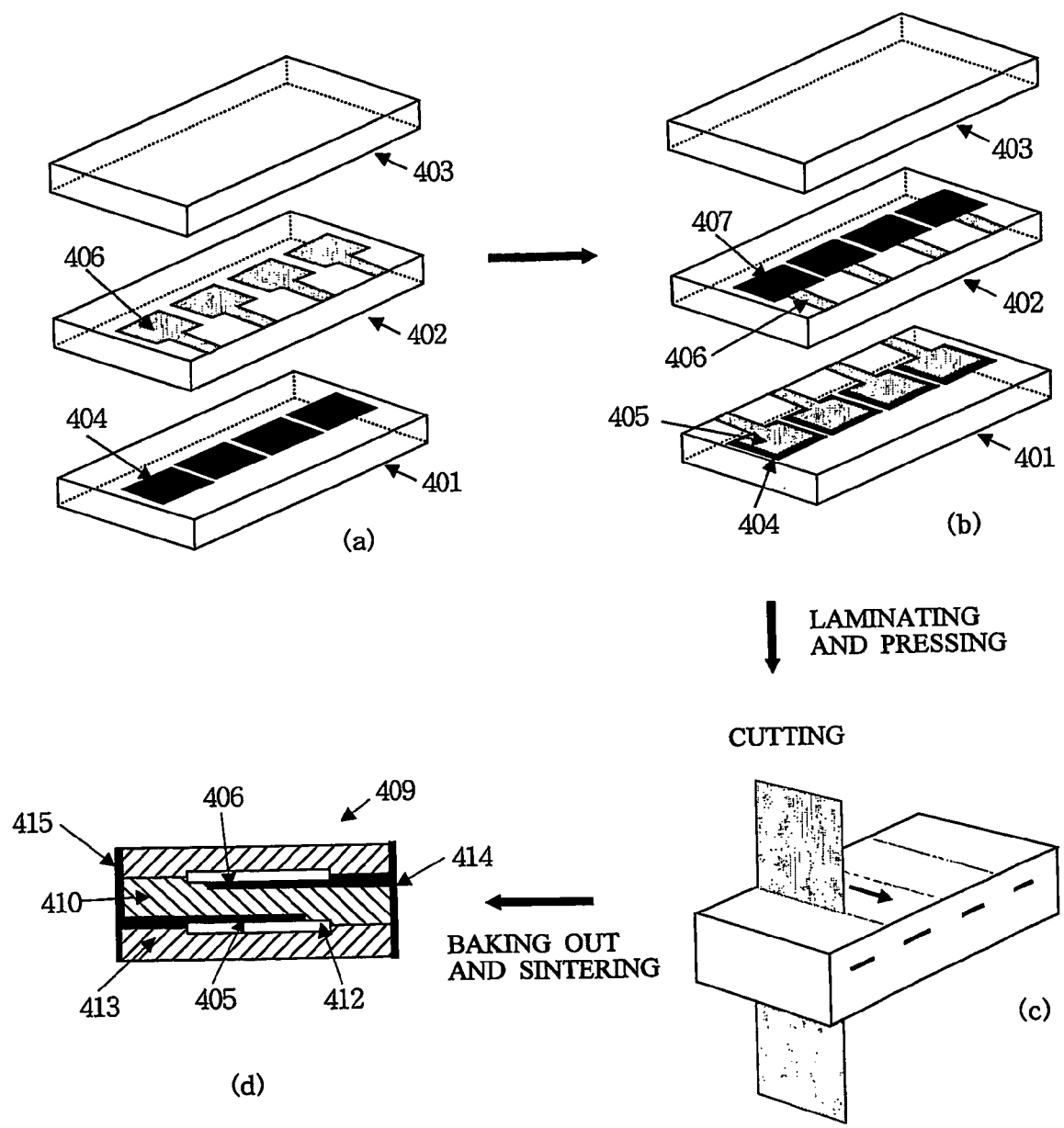
FIG. 4a-4b is an explanatory view of a fabricating process of a resonator according to Embodiment 2.

Referring to FIG. 4, a fabricating process of an organic matter applying type resonator according to the present invention will be explained in detail.

Using the same method as Embodiment 1, plural piezoelectric green sheets 401 to 403 having desired thickness are fabricated.

On a sheet 401 of the sheets as fabricated above, organic patterns 404 for vibration grooves are formed by applying organic paste, such as carbon paste or PVB- or PVA-based organic paste which can be baked out, by screen printing. The organic patterns may be in various shapes such as rectangle, circle and oval. The organic patterns are formed with a predetermined thickness so that the vibration grooves having a predetermined depth are formed after baking out, and positioned so that the vibration grooves are aligned with internal electrodes of the vibrator. The lower cover layer 401 is fabricated by forming lower internal electrodes 405 for the vibrator on the sheet on which the organic patterns, wherein the lower internal electrodes may metal electrodes of Ag, Pt, or the like formed by sputtering or may be printed with conductive paste by screen printing. A vibration active sheet 402 is fabricated by forming upper internal electrodes 406 for the vibrator on a piezoelectric sheet, of which the thickness is controlled up to ten micrometers as above, wherein the upper internal electrodes 406 may be metal electrodes of Ag, Pt, or the like formed by sputtering or may be printed with conductive paste by screen printing.

A green bar 408, which contains plural unit chips, is fabricated by laminating the sheets fabricated as above in the order of the lower cover layer 401, the vibration active sheet 402, and the upper cover layer 403.

The green bar 408 is pressed and cut into the unit chips 409. In order to remove the binder and organic matter of every kind in and between the sheets by burning the unit chip, the unit chip is baked out by heating it at below 300° C. Then, the piezoelectric element is completed by simultaneously sintering the vibration sheet and cover layers at a temperature for sintering the piezoelectric composition by increasing temperature. Vibration grooves 412 for vibration of the vibrator are formed since spaces are generated by burning and removing organic patterns 404, 407 for the vibration grooves between the upper and lower cover layers and the vibration sheet as well as the organic matter in the sheets.

The piezoelectric vibrator is completed by forming external electrodes 414, 415 on both ends of the piezoelectric element 409 sintered and fabricated as above so that the external electrodes are connected to the internal electrodes 405, 406, respectively, and by performing polling process, which causes the electric dipole to be oriented to one direction by applying the electric field in order to give the piezoelectricity. FIG. 4(d) is a cross-sectional view of the completed piezoelectric vibrator, wherein the cross-sectional plane thereof is similar to that shown in FIG. 2(d).

The resonator fabricated as above can achieve the high oscillating frequency corresponding to the thickness of the thin piezoelectric sheet since the internal electrodes 405, 406 are formed on the upper and lower surfaces of the thin piezoelectric sheet 410. Further, since the element is obtained by laminating the piezoelectric sheet and the cover layers and simultaneously sintering them, workability is improved and the process is simplified. Thus, the elements with various configurations are fabricated easily.

Embodiment 3

Figure 5:
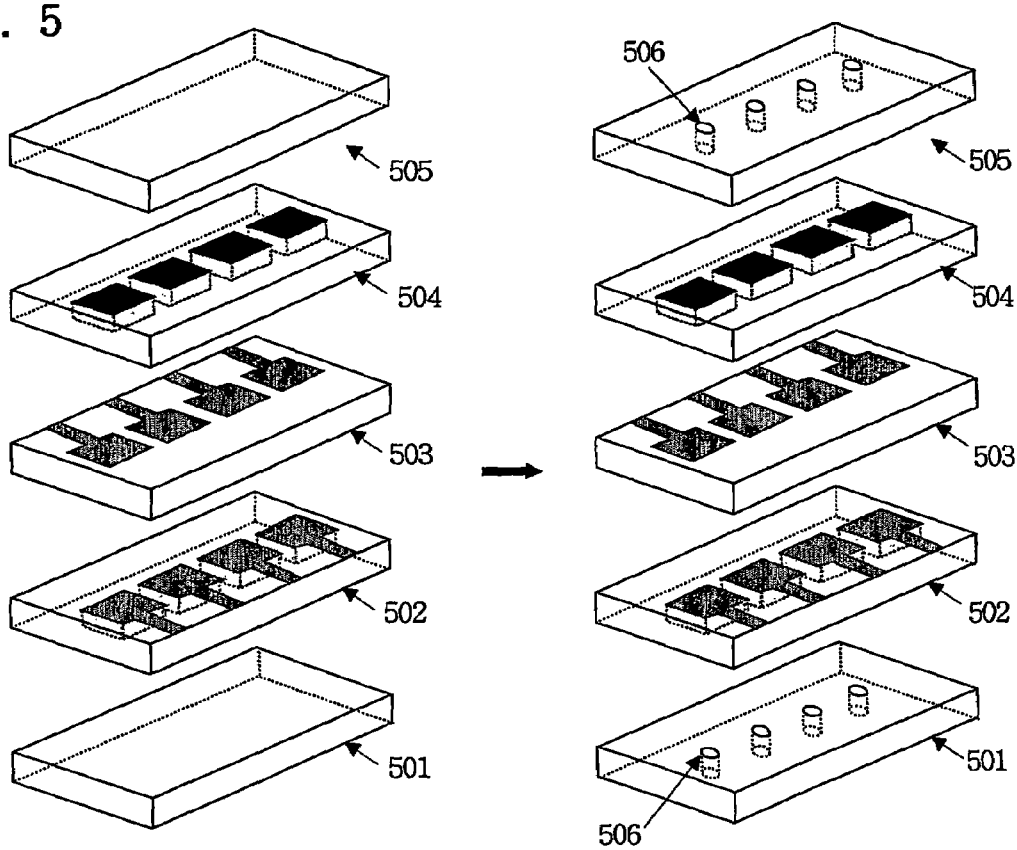
FIG. 5 is an explanatory view of a fabricating process of a resonator according to Embodiment 3.

Referring to FIG. 5, a fabricating process of a through-hole type resonator with burning passages according to the present invention will be explained in detail.

Using the same method as Embodiment 1, plural piezoelectric green sheets having desired thickness are fabricated. Also, a first lower cover layer 502, a vibration active sheet 503 and a first upper cover layer 504 of the present embodiment are the same as the first lower cover layer 302, the vibration active sheet 303, and the first upper cover layer 304 of Embodiment 1, respectively. A second upper cover layer 505 and a second lower cover layer 501, in which plural through-holes 506 for a burning passage are formed, are fabricated by punching two sheets among the fabricated sheets with a drilling machine. In such a case, the through-holes 506 for the burning passages are positioned so that they are aligned with the through-holes for the vibration grooves of the first upper and first lower cover layers 504, 502.

A green bar, which contains plural unit chips, is fabricated by laminating the sheets fabricated as above in the order of the second lower cover layer 501, the first lower cover layer 502, the vibration active sheet 503, the first upper cover layer 504, and the second upper cover layer 505.

The green bar is pressed and cut into the unit chips. In order to remove the binder and organic matter of every kind in the sheets and through-holes by burning the unit chip, the unit chip is baked out by heating it at below 300° C. Then, the piezoelectric element is completed by simultaneously sintering the vibration sheet and cover layers at a temperature for sintering the piezoelectric composition by increasing temperature. In this case, the organic matter in the through-holes of the cover layers as well as the sheets is burned and easily removed through the burning passages, so that the vibration grooves for vibration of the vibrator are formed.

The piezoelectric vibrator is completed by sealing the upper and lower burning passages of the piezoelectric element fabricated as above with epoxy for sealing, and forming external electrodes on both ends of the piezoelectric element so that the external electrodes are connected to the internal electrodes.

The resonator fabricated as above can achieve high oscillating frequency corresponding to the thickness of the thin piezoelectric sheet since the internal electrodes are formed on the upper and lower surfaces of the thin piezoelectric sheet. Further, since the organic matter of every kind is rapidly removed through the burning passages, and the vibrator is obtained by laminating the sheet and layers and simultaneously sintering them. Thus, workability for the vibrator is improved, and the vibrator with various configurations is fabricated easily.

Embodiment 4

Figure 6:
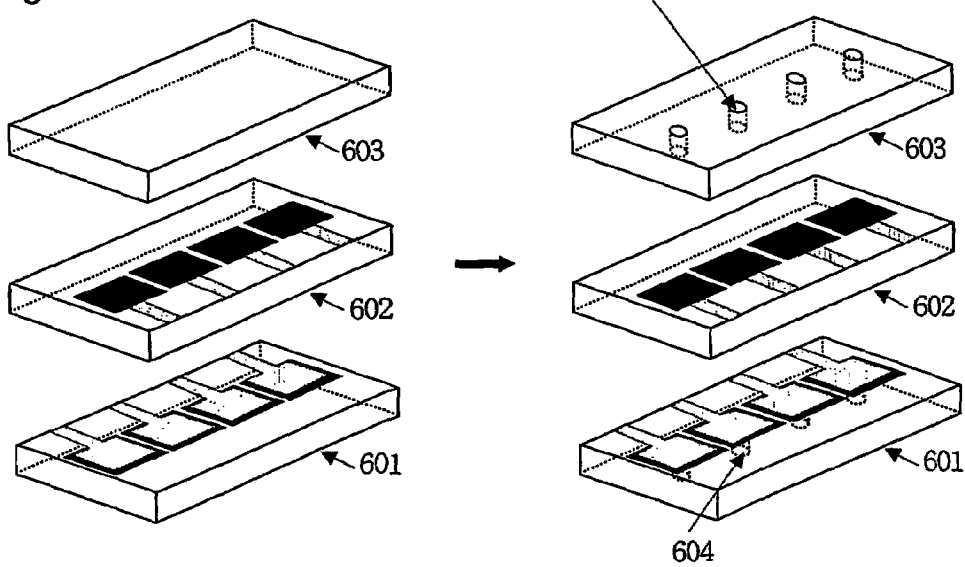
FIG. 6 is an explanatory view of a fabricating process of a resonator according to Embodiment 4.

Referring to FIG. 6, a fabricating process of an organic matter applying type resonator with the burning passages according to the present invention will be explained in detail.

Using the same method as Embodiment 1, plural piezoelectric green sheets having desired thickness are fabricated. Also, a lower cover layer 601, a vibration active sheet 602 and a upper cover layer 603 of the present embodiment are the same as the lower cover layer 401, the vibration active sheet 402, and the upper cover layer 403 of Embodiment 2 except that the lower and upper cover layers 601, 603 of the present embodiment are punched. That is, the lower cover layer 601 is fabricated by forming plural through-holes 604 for the burning passages with the drilling machine before forming organic patterns and lower internal electrodes, wherein the organic patterns and lower internal electrodes are formed according to the method described in Embodiment 2. The plural through-holes 604 for the burning passages are formed by punching the upper cover layer 603 among the fabricated sheets with the drilling machine. In such a case, the burning passages are positioned so that they are aligned with the organic patterns of the vibration active sheet.

A green bar, which contains plural unit chips, is fabricated by laminating the sheets fabricated as above in the order of the lower cover layer 601, the vibration active sheet 602, and the upper cover layer 603.

The green bar is pressed and cut into the unit chips. In order to remove the binder and organic matter of every kind in the sheets and between the lower and upper cover layers and the vibration active sheet by burning the unit chip, the unit chip is baked out by heating it at below 300° C. Then, a piezoelectric element is completed by simultaneously sintering the vibration sheet and cover layers at a temperature for sintering the piezoelectric composition by increasing temperature. In this case, since the organic matter between the cover layers and the vibration sheet as well as in the sheets is burned and easily removed through the burning passages, spaces are generated at the positions where the organic patterns existed, so that the vibration grooves for vibration of the vibrator are formed.

The piezoelectric vibrator is completed by sealing the upper and lower burning passages of the piezoelectric element fabricated as above with epoxy for sealing, and forming external electrodes on both ends of the piezoelectric element so that the external electrodes are connected to the internal electrodes.

The resonator fabricated as above can achieve high oscillating frequency corresponding to the thickness of the thin piezoelectric sheet since the internal electrodes are formed on the upper and lower surfaces of the thin piezoelectric sheet. Further, the organic matter of every kind is rapidly removed through the burning passages, and the vibrator is obtained by laminating the sheet and layers and simultaneously sintering them. Thus, workability is improved, and the vibrator with various configurations is fabricated easily.

Embodiment 5

In order for a piezoelectric element to oscillate, a capacitor is needed. A resonator fabricated integratedly with a capacitor is referred to as a resonator with built-in capacitor. The resonator with built-in capacitor will be explained below in detail.

Figure 7:
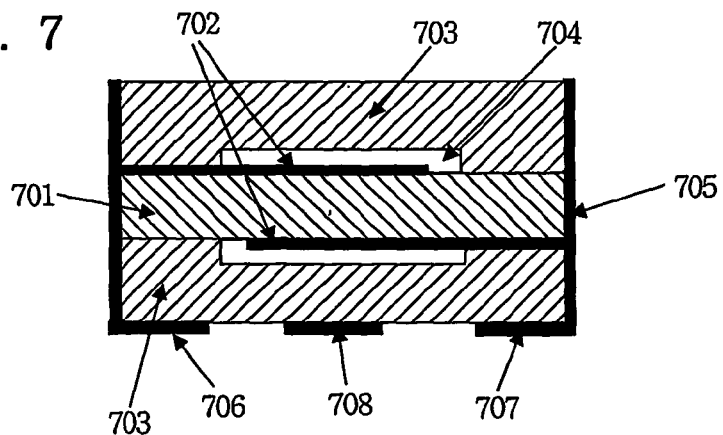
FIG. 7 is a view showing a structure of a resonator according to Embodiment 5.

FIG. 7 shows a resonator with built-in capacitor according to Embodiment 5.

The resonator with built-in capacitor of Embodiment 5 comprises a piezoelectric resonator portion R and a capacitor portion C. The piezoelectric resonator portion R comprises piezoelectric sheet 701 having piezoelectricity, internal electrodes 702 formed on the upper and lower surfaces of the piezoelectric sheet, cover layers 703, which are formed on the upper and lower surfaces of the piezoelectric sheet, and in which vibration grooves are formed, and external electrodes 705, which are formed on both the opposite ends of the piezoelectric sheet and cover layers, and each of which is connected to each of the internal electrodes. The capacitor portion C comprises a dielectric body, which the cover layers 703 fabricated of dielectrics function as, first and second surface external electrodes, respectively, and a third surface external electrode 708, which is formed in the middle of the surface of the dielectric body and insulated from the external electrodes 705.

The piezoelectric resonator portion is provided with the internal electrodes formed on the upper and lower surfaces of the piezoelectric sheet, of which the thickness is controlled up to tens micrometers in order to obtain oscillation of the desired high frequency, the plate type dielectrics, which are formed on upper and lower surfaces of the piezoelectric sheet and have the vibration grooves, and the external electrodes, each of which is connected to each of the internal electrodes and which are formed on both the opposite ends of the piezoelectric sheet and cover layers. The capacitor portion is the structure that three surface external electrodes are formed on a surface of any one of the upper and lower dielectrics, on which the vibration grooves are formed.

The fabricating process of such a resonator with built-in capacitor will be explained below.

Using the same method as Embodiments 1 to 4, the piezoelectric body is fabricated. The extreme upper and lower cover layers of the piezoelectric body are fabricated of dielectrics having desired composition. That is, using the dielectric raw material powder, which is available for industrial use, the raw material powder having the desired dielectric composition is provided. In order to prepare dielectric green sheets, slurry is produced by adding binder to the provided dielectric ceramic powder and using general slurry fabricating method. Dielectric green sheets having desired thickness are fabricated of the slurry by using a doctor blade or the like. Using the fabricated dielectric green sheets, according to the same method as Embodiments 1 to 4, the extreme upper and lower cover layers of the vibrator are fabricated, and the element body is fabricated through the laminating, cutting, and simultaneously sintering process.

The external electrodes 705, each of which is connected to each of the internal electrodes 702, are formed on both the ends of the element body. The first and second surface external electrodes 706, 707, each of which is connected to each of the external electrodes at both the ends of the dielectric, are formed on the surface of any one of the upper and lower dielectric cover layers. The third surface external electrode 708 insulated from the external electrodes, is formed on the middle of the surface of the dielectric. The piezoelectric vibrator is completed by performing polling process, which causes the electric dipole to be oriented to one direction by applying the electric field in order to give the piezoelectricity.

Figure 8:
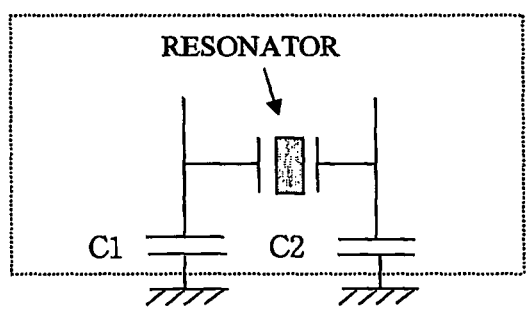
FIG. 8 is a view of an equivalent circuit of a resonator with built-in capacitor.

As can be seen from an equivalent circuit of FIG. 8, the completed resonator with built-in capacitor comprises the resonator and the capacitors in a unit chip, which are in the portion drawn by a dotted line, wherein the capacitors C1, C2 are connected to both the ends of the resonator, respectively.

Since the resonator with built-in capacitor having such a structure is provided with the internal electrodes on the upper and lower surfaces of the thin piezoelectric sheet, the high oscillating frequency corresponding to the thickness of the thin piezoelectric sheet can be obtained. Also, since the cover layers where the vibration grooves are formed are dielectrics, the cover layers functions as capacitors. Thus, the capacitors are included in a unit chip. Thus, it is possible to fabricate the compact element, which can be easily applied to a compact electronic device.

Embodiment 6

FIG. 9 shows a resonator with built-in capacitor according to Embodiment 6. The resonator with built-in capacitor of Embodiment 6 comprises a piezoelectric resonator portion R and a capacitor portion C. The piezoelectric resonator portion R comprises a piezoelectric sheet 901 having the piezoelectricity, internal electrodes 902 formed on the upper and lower surfaces of the piezoelectric sheet, cover layers 904, which are formed on the upper and lower surfaces of the piezoelectric sheet, and in which vibration grooves are formed, and side external electrodes 908, which are formed at both sides of the piezoelectric sheet and cover layers, and each of which is connected to each of the internal electrodes. The capacitor portion C comprises a dielectric sheet 905, first capacitor internal electrodes 906, which are formed on the dielectric sheet, and each of which is connected to each of the side external electrodes 908, and a second capacitor internal electrode 907, which is formed on the dielectric sheet, insulated from the side external electrodes 908, and connected to an intermediate external electrode 909 formed on the front side of the piezoelectric sheet and cover layers.

The piezoelectric resonator portion is provided with the internal electrodes on the upper and lower portions of the thin piezoelectric sheet, of which the thickness is controlled up to tens micrometers in order to achieve the desired high oscillating frequency. Then, the cover layers, on which the vibration grooves are formed, are provided on the upper and lower portions of the piezoelectric sheet. The capacitor portion is integrated with the piezoelectric resonator portion, is the structure that dielectric sheets on which the capacitor internal electrodes formed are laminated, and controls the capacitance by adjusting the pattern of the internal electrodes on the dielectric sheets and the number of the laminated dielectric sheets.

Figure 9A:
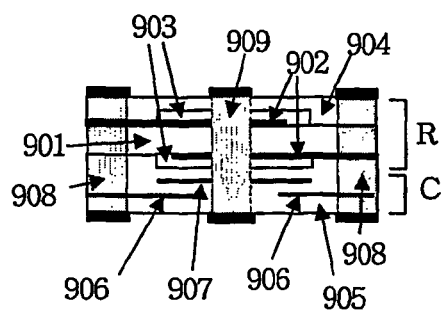
FIGS. 9a, 9b, 9c, 9d (steps a-c) and 9e are views showing structures of a resonator according to Embodiment 6 and an explanatory view of a fabricating process thereof.
Figure 9B:
Figure 9C:
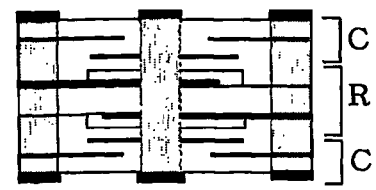

The capacitor portion C may be bonded to the lower portion of the piezoelectric resonator portion R as shown in FIG. 9*a*, the upper portion thereof as shown in FIG. 9*b*, or the upper and lower portions thereof as shown in FIG. 9*c*.

Figure 9D:
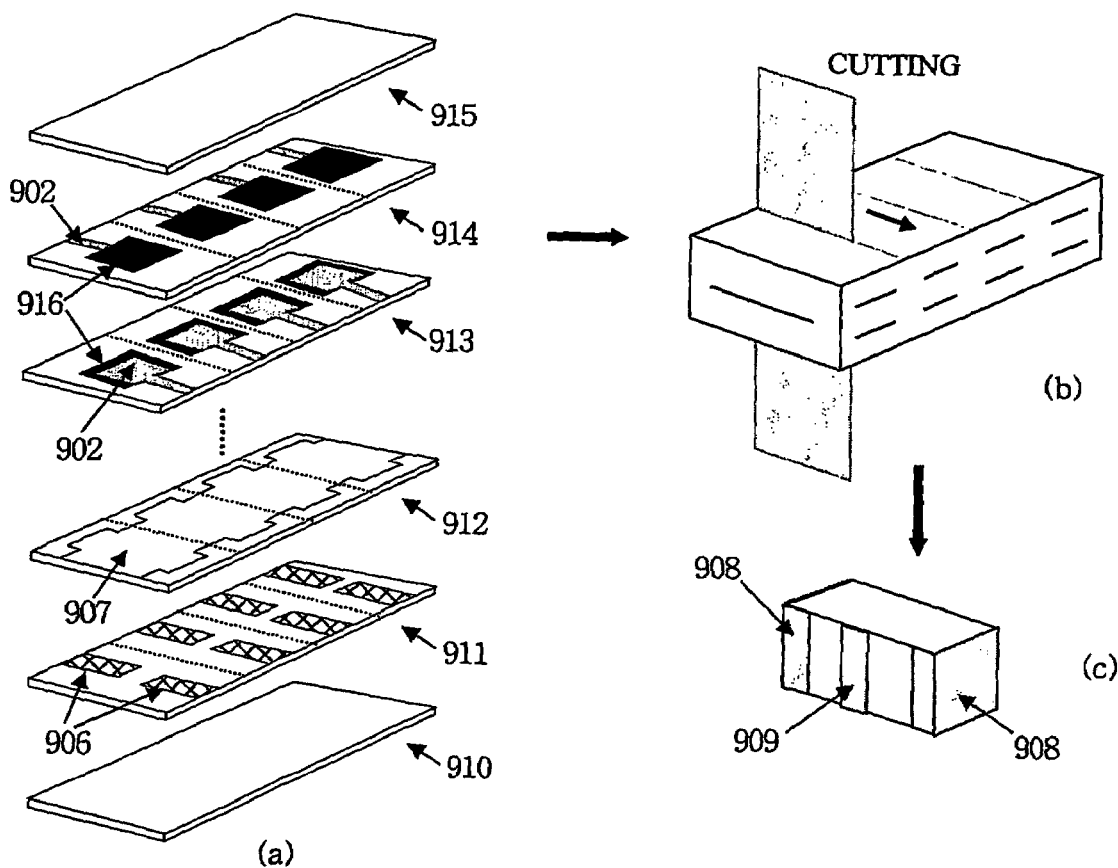
Figure 9E:
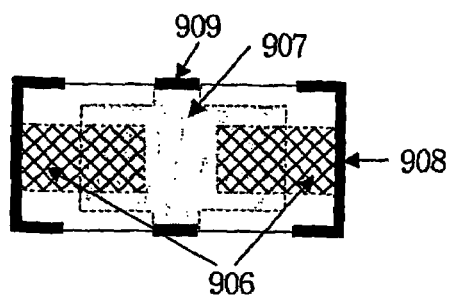

Referring to FIG. 9*d*, the fabricating process of such a resonator with built-in capacitor will be explained below.

As the piezoelectric resonator portion, piezoelectric sheets 913, 914, 915 are fabricated by forming the piezoelectric sheets using the same method as Embodiments 1 to 4 and forming the electrodes thereon. The upper cover layer 915 is made of piezoelectrics or dielectrics.

In order to fabricate the capacitor portion, using the dielectric raw material powder, which is available for industrial use, the raw material powder having the desired dielectric composition is provided. In order to prepare dielectric green sheets, the slurry is produced by adding binder to the provided dielectric ceramic powder, and using general slurry fabricating method. Dielectric sheets 910, 911, 912 having desired thickness are fabricated of the slurry by using the doctor blade or the like.

The first dielectric sheet 911 is fabricated by forming the first capacitor internal electrodes 906 on one of the dielectric sheets fabricated as above, wherein in the unit chip separated by a dotted line, the first capacitor internal electrodes, each of which is connected to each of the side external electrodes 908 at each side end of the unit chip, are separated from each other. Also, the second capacitor sheet 912 is fabricated by forming the second dielectric internal electrode 907 on another dielectric sheet, wherein the second capacitor internal electrode 907 is connected to the intermediate external electrode 909 on the front side of the unit chip and is spaced from both the side ends of the unit chip. The structure of the side unit chip is spaced from both the side ends of the unit chip. The structure of the capacitor internal electrodes and the external electrodes of each unit chip is well known in FIG. 9*e*.

The dielectric sheets 910 to 912 and the piezoelectric sheets 913 to 915 are laminated. The dielectric sheets may be laminated on the upper or lower portion or both the upper and lower portions of the piezoelectric resonator. The number of the dielectric sheets to be laminated maybe controlled in order to achieve desired capacitance.

A unit chip element body is fabricated by cutting and simultaneously sintering the laminate of the dielectric sheets and the piezoelectric resonator portion by using the same method as embodiments 1 to 4.

The side external electrodes 908, each of which is connected to each of the internal electrodes 902 of the piezoelectric resonator portion and each of the first capacitor internal electrodes 906, are formed on both the ends of the unit chip element body. The intermediate external electrode 909 connected to the second capacitor internal electrode 907, is formed on the front side of the outside of the unit chip element. Then, the piezoelectric vibrator is completed by performing polling process, which causes the electric dipole to be oriented to one direction by applying the electric field in order to give the piezoelectricity.

As can be seen from the equivalent circuit of FIG. 8, the completed resonator with built-in capacitor comprises the resonator and the capacitors in a unit chip, which are in the portion drawn by a dotted line, wherein the capacitors C1, C2 are connected to both the ends of the resonator, respectively. In such a case, the resonator with built-in capacitor shown in FIG. 9c realizes the maximum capacitance since two capacitors are separately connected to the respective terminals of the resonator in parallel.

Since the resonator with built-in capacitor having such a structure is provided with the internal electrodes on the upper and lower portions of the thin piezoelectric sheet, the high oscillating frequency corresponding to the thickness of the thin piezoelectric sheet can be achieved. Further, since the resonator with built-in capacitor is the laminate of the piezoelectric resonator portion and the dielectric sheets wherein the internal electrodes are formed on the dielectric sheets functioning as capacitors, the capacitors are included in a unit chip. Thus, it is possible to fabricate the compact element, which can be easily applied to a compact electronic device.

Embodiment 7

Figure 10A:
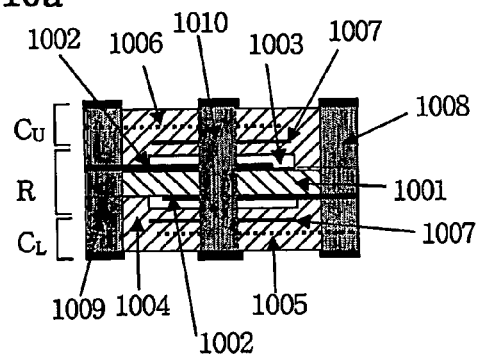
FIGS. 10a and 10b (steps a-c) are a view showing a structure of a resonator according to Embodiment 7 and an explanatory view of a fabricating process thereof.

FIG. 10a shows a resonator with built-in capacitor according to Embodiment 7. The resonator with built-in capacitor of Embodiment 7 comprises a piezoelectric resonator portion R, a lower capacitor portion $C_L$, and an upper capacitor portion $C_U$.

The piezoelectric resonator portion R comprises a piezoelectric sheet 1001 having the piezoelectricity, internal electrodes 1002 formed on the upper and lower portions of the piezoelectric sheet, cover layers, which are formed on the upper and lower surfaces of the piezoelectric sheet, and in which vibration grooves 1003 are formed, and side external electrodes 1008, 1009, which are formed on both the opposite sides of the piezoelectric body, and each of which is connected to each of the internal electrodes 1002. The lower capacitor portion $C_L$ comprises a dielectric sheet 1004, a first capacitor internal electrode 1005, which is formed on a surface of the dielectric sheet and is connected to the side external electrode 1008, and a second capacitor internal electrode 1007, which is formed on the dielectric sheet, insulated from the side external electrodes 1008, 1009, and connected to an intermediate external electrode 1010 formed on the front side of the piezoelectric body. The upper capacitor portion $C_U$ comprises another dielectric sheet 1004, a third capacitor internal electrode 1006, which is formed on the dielectric sheet and is connected to the side external electrode 1009, and the second capacitor internal electrode 1007, which is formed on the dielectric sheet, insulated from the side external electrodes 1008, 1009, and connected to an intermediate external electrode 1010.

The piezoelectric resonator portion is provided with the internal electrode on the upper and lower portions of the thin piezoelectric sheet, of which the thickness is controlled up to tens micrometers in order to achieve the desired high oscillating frequency. Then, the cover layers (that is, dielectric layers), on which the vibration grooves are formed, are provided on the upper and lower portions of the piezoelectric sheet.

The capacitor portion is integrated with the piezoelectric resonator portion, is the structure that dielectric sheets on which the capacitor internal electrodes are formed are laminated, and controls the capacitance by adjusting the pattern of the internal electrodes on the dielectric sheets and the number of the laminated dielectric sheets. Particularly, the capacitor portion includes the lower capacitor portion, which is bonded to the lower portion of the piezoelectric resonator and connected to any one of the terminals (that is, the external electrodes) of the piezoelectric resonator, and the upper capacitor portion, which is bonded to the upper portion of the piezoelectric resonator and connected to the other one of the terminals (that is, the external electrodes) of the piezoelectric resonator.

Figure 10B:
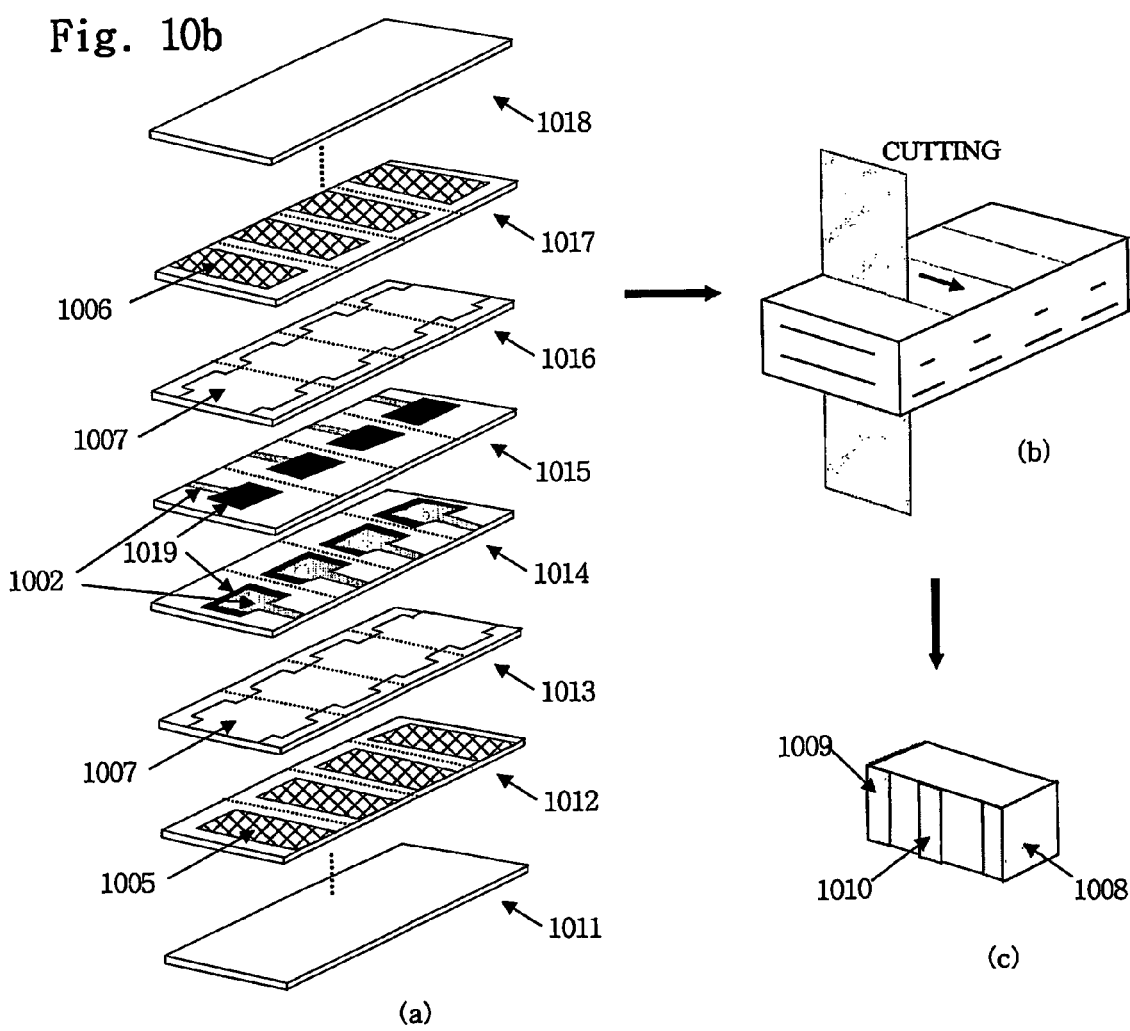

Referring to FIG. 10b, the fabricating process of such a resonator with built-in capacitor will be explained below.

As the piezoelectric resonator portion, dielectric sheets 1014, 1015 are fabricated by forming the piezoelectric sheets using the same method as Embodiments 1 to 4 and forming the electrodes thereon. The upper and lower cover layers 1016, 1013 are made of dielectrics and function as a portion of a capacitor and as cover layers.

In order to fabricate the capacitor portion, using the dielectric raw material powder, which is available for industrial use, the raw material powder having the desired dielectric composition is provided. In order to prepare the dielectric green sheets, the slurry is produced by adding binder to the provided dielectric ceramic powder, and using general slurry fabricating method. Plural dielectric green sheets 1011 to 1013, 1016 to 1018 having desired thickness are fabricated of the slurry by using the doctor blade or the like.

A first dielectric sheet 1012 is fabricated by forming the first capacitor internal electrodes 1005 on one of the dielectric sheets fabricated as above, wherein in the unit chip separated by a dotted line, the first capacitor internal electrode is connected to the external electrodes 1008 at a side end of the unit chip. The second dielectric sheets 1013, 1016 are fabricated by forming the second capacitor internal electrodes 1007 on other dielectric sheets, wherein in the unit chip, the second capacitor internal electrode 1007 is connected to the intermediate external electrode 1010 on the front side of the unit chip. Also, a third dielectric sheet 1017 is fabricated by forming the third capacitor internal electrodes 1006 on another dielectric sheet, wherein in the unit chip, the third capacitor internal electrode 1006 is connected to the external electrodes 1008 at the other side end of the unit chip.

The dielectric sheets and piezoelectric sheets are laminated in the order of the dielectric sheet 1011 constituting the lower capacitor, the first dielectric sheet 1012, the second dielectric sheet 1013, the piezoelectric dielectric sheets 1014, 1015, the second dielectric sheet 1016, the third dielectric sheet 1017, and the dielectric sheet 1018 constituting the upper capacitor. In such a case, the laminated number of the dielectric sheets may be controlled in order to control the capacitance.

The unit chip element body is fabricated by cutting and simultaneously sintering the laminate of the dielectric sheets and the piezoelectric resonator portion with the same method as Embodiments 1 to 4.

The side external electrode 1008 and the side external electrode 1009 are formed on both the ends of the element body, wherein the side external electrode 1008 is connected to the internal electrode 1002 of the piezoelectric resonator portion and the first capacitor internal electrode 1005, and wherein the side external electrode 1009 is connected to the internal electrode 1002 of the piezoelectric resonator portion and the third capacitor internal electrode 1007. On the front and/or rear portion of the element body, the intermediate external electrode 1010 connected to the second capacitor internal electrode 1007 is formed. Then, the piezoelectric vibrator is completed by performing polling process, which causes the electric dipole to be oriented to one direction by applying the electric field in order to give the piezoelectricity.

As can be seen from the equivalent circuit of FIG. 8, the completed resonator with built-in capacitor comprises the resonator and the capacitors in a unit chip, which are in the portion drawn by a dotted line, wherein the capacitors C1, C2 are connected to both the ends of the resonator, respectively.

Since the resonator with built-in capacitor having such a structure is provided with the internal electrodes on the upper and lower portions of the thin piezoelectric sheet, the high oscillating frequency corresponding to the thickness of the thin piezoelectric sheet can be achieved. Further, since the resonator with built-in capacitor is the laminate of the piezoelectric resonator portion and the dielectric sheets, wherein the internal electrodes are formed on the dielectric sheets functioning as capacitors, the capacitors are included in a unit chip. Thus, it is possible to fabricate the compact element, which can be easily applied to a compact electronic device.

Embodiment 8

The vibrators with the high oscillating frequency are proposed in the embodiments described above, wherein the vibrators are fabricated by simultaneously sintering the piezoelectric body, which is fabricated of a piezoelectric sheet with its thickness precisely controlled, and the cover layers, on which the vibration grooves are formed. Applying the foregoing, the vibrators with the high oscillating frequency are provided in the following embodiments including the present embodiment by laminating plural piezoelectric sheets with its thickness precisely controlled, providing internal electrodes between the piezoelectric sheets, and controlling the patterns of the internal electrodes.

Figure 11:
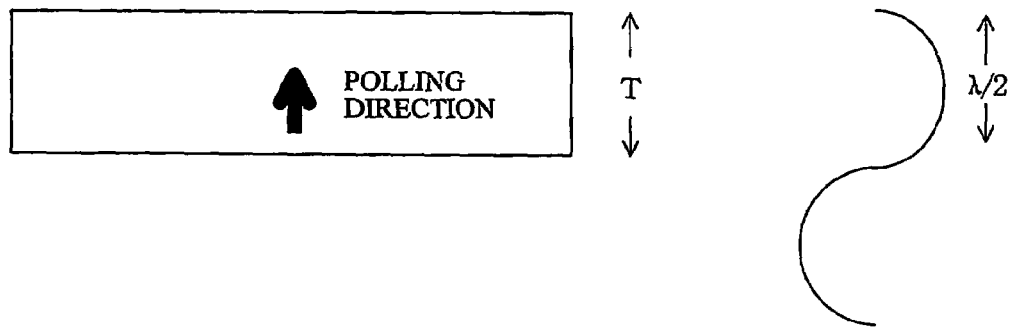
FIG. 11 is a view showing vibration of a single plate type resonator
Figure 12A:
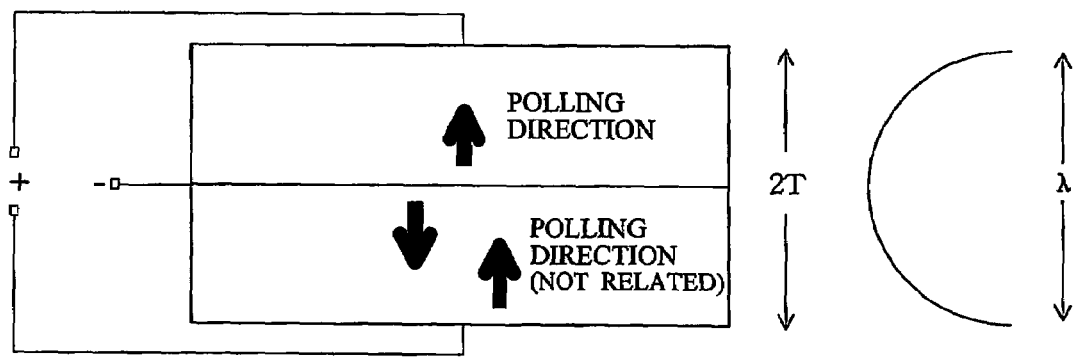
FIGS. 12a and 12b are views showing vibration of a resonator according to a wiring pattern.
Figure 12B:
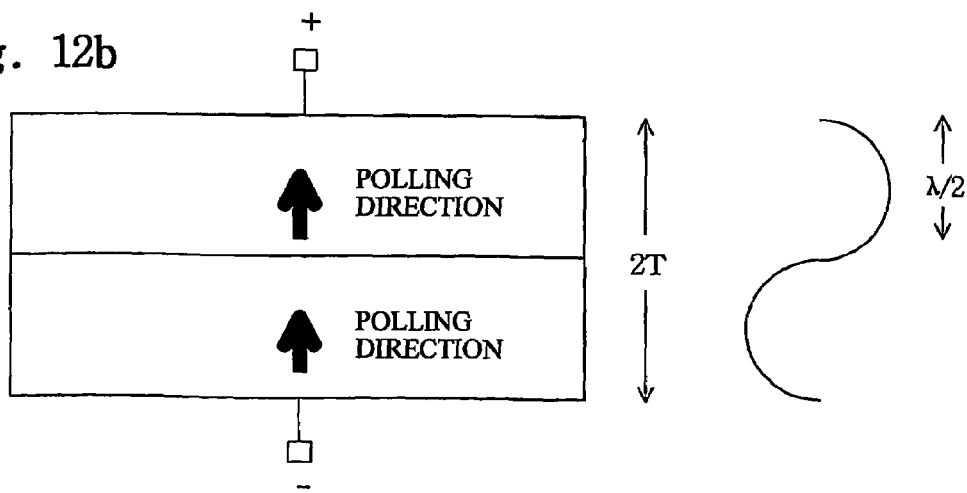

First, referring to FIGS. 11, 12a, and 12b, oscillating principle of a vibrator or resonator fabricated by controlling patterns of the internal electrodes will be described. As shown in FIG. 11, let the oscillating frequency of a single plate type resonator of the thickness T be fa. In the case that the entire thickness of the resonators is 2T by laminating two resonators, each of which has the thickness T as shown in FIGS. 12a and 12b, the oscillating frequency of the resonator varies by two times according to wiring of electrodes in two laminated resonators. That is, if polarity of upper and lower electrodes is different from that of an intermediate electrode as shown in FIG. 12a, the wavelength increases double. Thus, the oscillating frequency due to a fundamental vibration of the resonator becomes ½ fa, so that the frequency decreases half compared with the frequency described in FIG. 11. However, if polarity of the upper electrode is different from that of the lower electrode as shown in FIG. 12b, and if intermediate electrode (or internal electrode) is not wired, the wavelength decreases half since the upper and lower surfaces of the element are charged with electricity as (+) and (−), respectively, as electric field is applied like a capacitor. Thus, the oscillating frequency of the resonator becomes fa, which is the same as the frequency described in FIG. 11. That is, although the number of the laminated layers of the resonator increases, the same oscillating frequency can be obtained. Thus, the resonator with the high oscillating frequency can be obtained by thinning the single plate type piezoelectric body of the resonator. Also, since the well-workable, desired thickness of an element can be obtained by laminating the single plate type piezoelectric bodies, which have the same thickness, and by controlling the wiring of electrodes, the vibrator with the desired frequency and thickness can be fabricated.

Figure 13A:
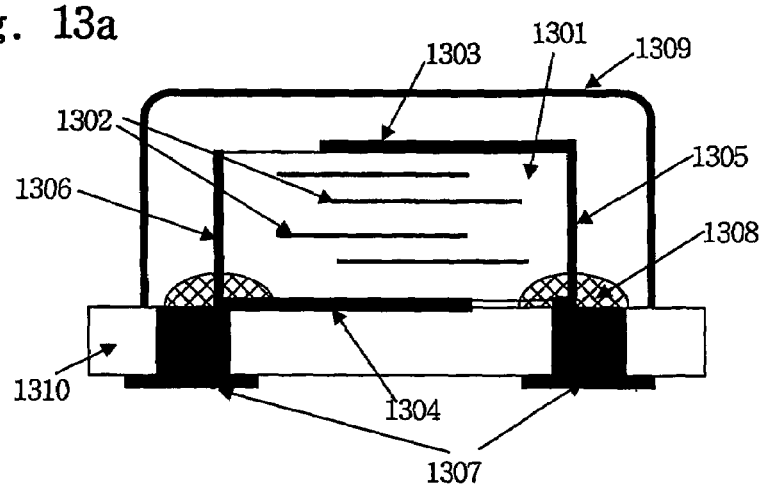
FIGS. 13a and 13b (steps a-c) are a view showing a structure of a resonator according to Embodiment 8 and an explanatory view of a fabricating process thereof.

Referring to FIG. 13a, a resonator according to the present embodiment will be explained in detail.

The resonator comprises a piezoelectric body 1301 having the piezoelectricity, internal electrodes 1302 formed in the piezoelectric body, an upper electrode 1303 and a lower electrode 1304, which are formed on the upper and lower portions of the piezoelectric body, respectively, and to which the electric power is supplied, side electrodes 1305, 1306, which are connected to the upper electrode 1303 and the lower electrode 1304, respectively, external terminals 1307, and a protective cap 1309. The internal electrodes 1302 are not connected to the upper electrode 1303, the lower electrode 1304, and the side electrodes 1305, 1306. The side electrodes 1305, 1306 are formed on both the opposite sides of the piezoelectric body. The upper electrode 1303 and the lower electrode 1304 are connected to the side electrode 1305 and the side electrode 1306, respectively, each of which is also connected to each of the external terminals 1307 at both the ends of the piezoelectric body. The protective cap 1309 protects the whole of the piezoelectric body by enclosing it.

The piezoelectric body is a laminate of piezoelectric sheets, of which the thickness is controlled up to tens micrometers in order to obtain a high oscillating frequency. The internal electrodes are printed on a partial or near complete surface of the sheets so that the internal electrodes are spaced from the ends of the sheets in order not to be connected to the side, upper and lower external electrodes on the thin piezoelectric sheets. The lower portion of the piezoelectric body is further provided with the insulating substrate 1310. By forming through-holes at both sides of the insulating substrate, the external terminals 1307 are formed in the through-holes. The external terminals are connected to the side and upper external electrodes and the side and lower external electrodes, respectively, at both the sides of the piezoelectric body with conductive adhesive 1308. The piezoelectric body where all of the electrodes are formed are enclosed and protected by the protective metal cap 1309.

Figure 13B:
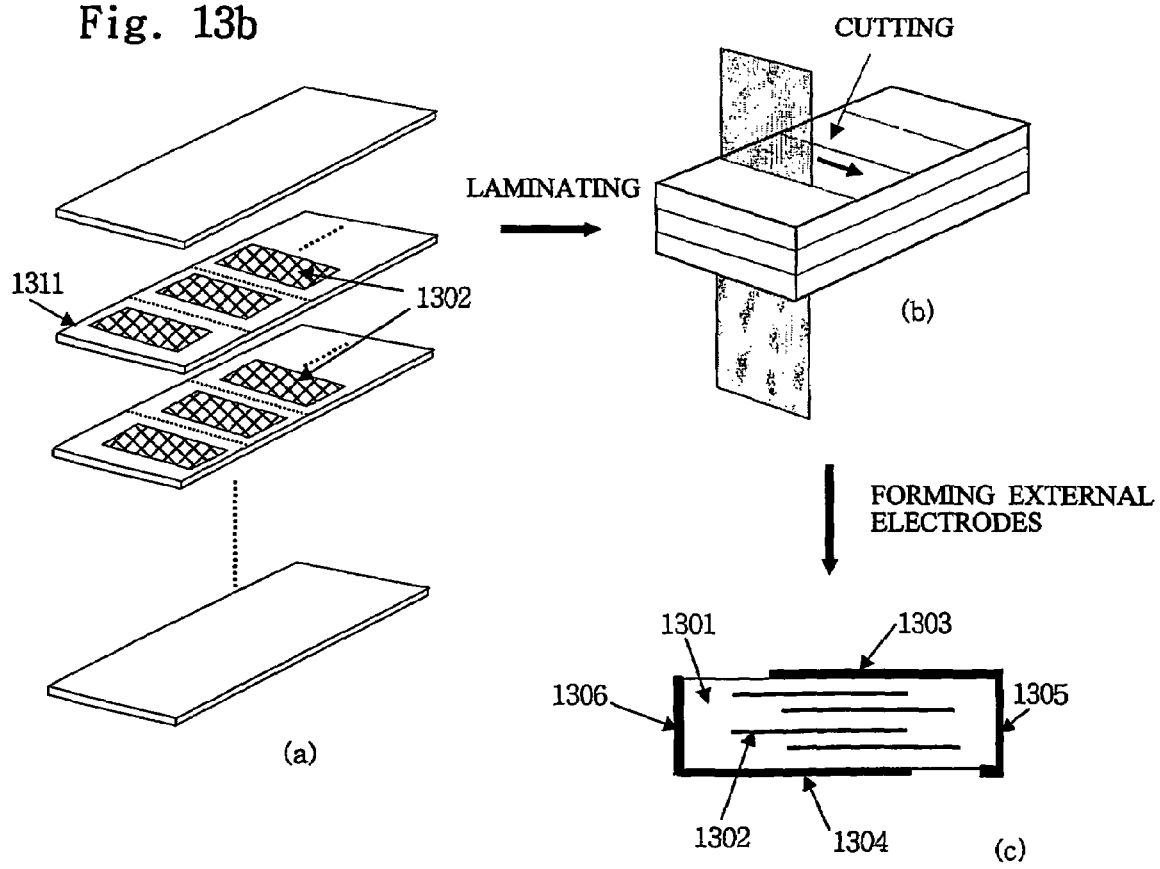

Referring to FIG. 13b, the fabricating process of such a resonator will be explained below.

Using the same method as Embodiment 1, piezoelectric green sheets 1311 having desired thickness are fabricated. The internal electrodes 1302 are formed in the sheets so that they are spaced from the ends of the sheets in order not to be connected to the edges of the sheets by using thick film deposition, such as screen printing, or thin film deposition, such as sputtering, evaporation, chemical vapor deposition, or sol-gel coating. In such a case, the spaced distance between the internal electrode 1302 and an edge of the sheets may be different from that between the internal electrode 1302 and the other opposite edge of the sheets.

After the desired number of the sheets on which the internal electrodes are formed are alternatively laminated so that the spaced distance between the internal electrode 1302 and the side electrode 1305 is alternatively different from that between the internal electrode 1302 and the side electrode 1306, the laminated piezoelectric body 1301 for a unit element is fabricated by cutting the laminate in unit elements (as indicated by dotted lines). After the laminate are baked out by heating it in order to remove every kind of binder component in the laminate, the laminate are sintered at sintering temperature of the piezoelectric composition by increasing temperature.

The upper electrode 1303 and the lower electrode 1304, which are not connected to the internal electrodes 1302 of the laminate, are formed outside the piezoelectric body 1301 fabricated above. The side electrodes 1305, 1306, which are connected to the upper and lower electrodes, respectively, are formed on both the sides of the piezoelectric body. In such a case, the upper, lower and side external electrodes are formed by using thick film deposition, such as screen printing, or thin film deposition, such as sputtering, evaporation, chemical vapor deposition, or sol-gel coating. FIG. 13b(c) is a cross-sectional view of the completed element where the external electrodes are formed, wherein the cross-sectional plane thereof is similar to that shown in FIG. 2(d).

The polling process is performed by applying the electric power to both the external electrodes of the piezoelectric body where the electrodes are formed, so that the piezoelectric dipole is oriented. After the polled piezoelectric body is positioned on the insulating substrate, wherein the external terminals are formed in the through-holes formed in both the ends of insulating substrate, each of the external electrodes on both the ends of the piezoelectric body is bonded to each of the external terminals by using a conductive adhesive. The resonator element is completed by capping the piezoelectric body, which is positioned on the insulating substrate as described above, using the protective metal cap, which is generally available.

The resonator with such a structure can be caused to obtain the high oscillating frequency corresponding to the thickness of the piezoelectric sheet by forming the internal electrodes on the thin piezoelectric sheets. Also, since the elements having the desired thickness can be obtained by laminating the piezoelectric sheets, workability is improved. Thus, the elements with various configurations are easily fabricated.

Embodiment 9

Referring to FIGS. 14a to 14d, a resonator according to Embodiment 9 of the present invention will be explained in detail.

Figure 14A:
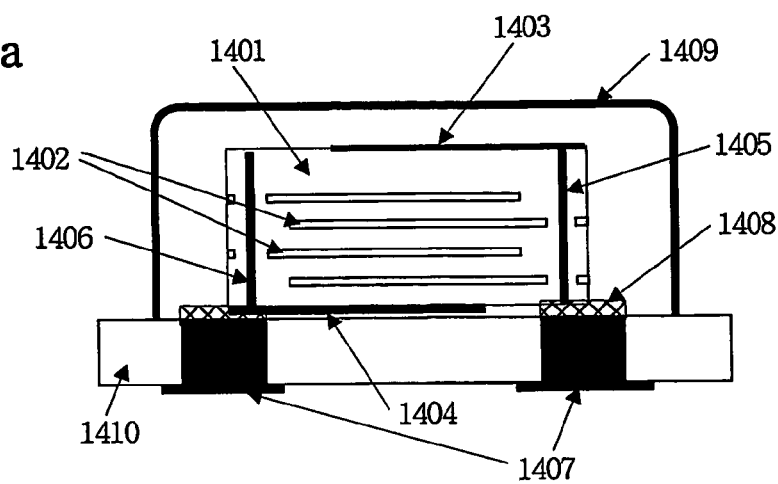
FIGS. 14a, 14b (steps a-c), 14c and 14d are views showing structures of a resonator according to Embodiment 9 and an explanatory view of a fabricating process thereof.
Figure 14B:
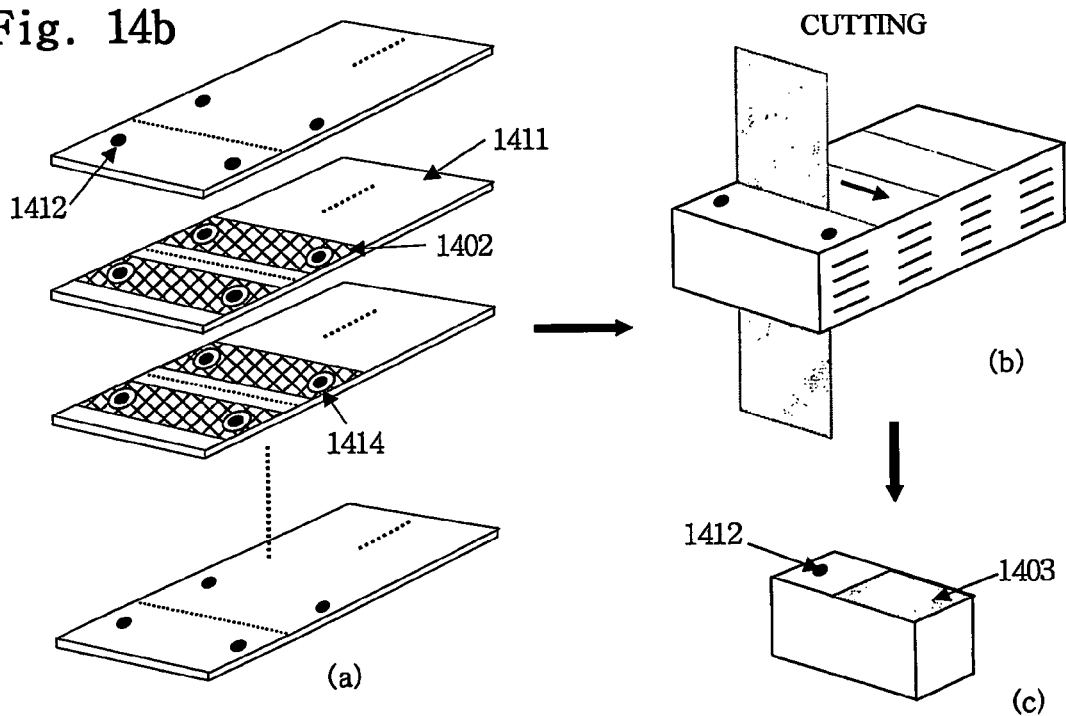

As shown in FIG. 14a, the resonator of the present embodiment comprises a piezoelectric body 1401 having the piezoelectricity, internal electrodes 1402, an upper electrode 1403 and a lower electrode 1404, which are formed on the upper and lower surfaces of the piezoelectric body, respectively, and to which the electric power is supplied, external terminals 1407, and a protective cap 1409 enclosing the entire of the piezoelectric body. The internal electrodes 1402 are formed in the element body and not connected to the upper electrode 1403 and the lower electrode 1404. The external terminals 1407 are connected to the upper and lower electrodes, respectively, through conductive passages 1406, which pass through the piezoelectric body and are insulated from the internal electrodes.

The piezoelectric body is a laminate of piezoelectric sheets, of which the thickness is controlled up to tens micrometers in order to obtain the high oscillating frequency. The internal electrodes are printed on a partial or near complete surface of the sheets so that the internal electrodes are not connected to the upper and lower external electrodes on the thin piezoelectric sheets and are insulated from the conductive passages for the through-holes. The lower portion of the piezoelectric body is further provided with the insulating substrate 1410. By forming the through-holes at both the sides of the insulating substrate, the external terminals 1407 are formed in the through-holes. Each of the external terminals is connected to each of the upper and lower external electrodes at both lower sides of the piezoelectric body with conductive adhesive. The piezoelectric body where all of the electrodes are formed are enclosed and protected by the protective metal cap 1409.

The fabricating process of such a resonator will be explained below.

Figure 14C:
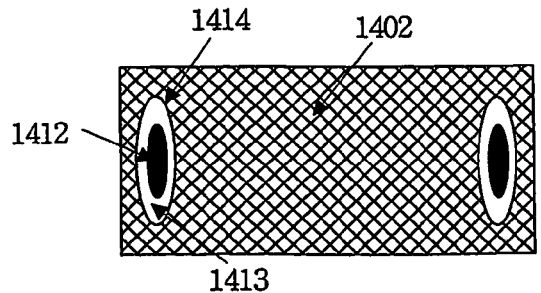
Figure 14D:
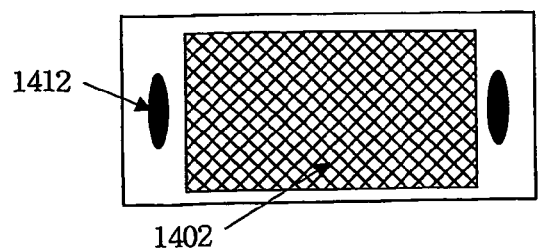

Using the same method as Embodiment 1, piezoelectric green sheets 1411 having desired thickness are fabricated. Through-holes 1412 for the conductive passages are formed at both the sides of the plural green sheets fabricated as above with the punching machine. The internal electrodes are formed on the sheets, on which the through-holes are formed, with conductive paste so that the internal electrodes do not contact with the conductive passages. The internal electrodes and the insides of the through-holes are simultaneously printed. In such a case, the internal electrodes are printed on the about entire surface of the sheets with certain spacing 1413 from the conductive passages of the through-holes as shown in FIG. 14c, or on the partial surface of the sheets which is separated from the conductive passages of the through-holes as shown in FIG. 14d.

After the desired numbers of the sheets on which the internal electrodes are formed are laminated, the laminated piezoelectric body for a unit element is fabricated by cutting it in unit elements (as indicated by dotted lines). After the laminate is baked out by heating it in order to remove every kind of binder component in the laminate, the laminate are sintered at a proper temperature by increasing the temperature. The upper electrode and the lower electrode, which are not connected to each of the internal electrodes of the laminate, are formed outside the sintered laminate. In such a case, each of the upper and lower electrodes is insulated from the internal electrodes and connected to the conductive paste of each of the through-holes. The polling process is performed by applying the electric power to the external electrodes of the piezoelectric body, where the electrodes are formed, so that piezoelectric dipole is oriented. After the piezoelectric body fabricated as above is positioned on the insulating substrate, wherein the terminals are formed in the through-holes formed in both the ends of the insulating substrate, each of the external electrodes of the piezoelectric body is bonded to each of the external terminals of the insulating substrate through the conductive passages by using a conductive adhesive. Then, the resonator element is completed by capping the piezoelectric body using the protective metal cap, which is generally available, in order to enclose piezoelectric body with the protective cap.

The resonator with such a structure can be caused to obtain the high oscillating frequency corresponding to the thickness of the piezoelectric sheets by forming the internal electrodes on the thin piezoelectric sheets. Also, since the elements with desired thickness can be obtained by laminating the piezoelectric sheets, workability is improved. Thus, the elements are easily fabricated.

Embodiment 10

Figure 15A:
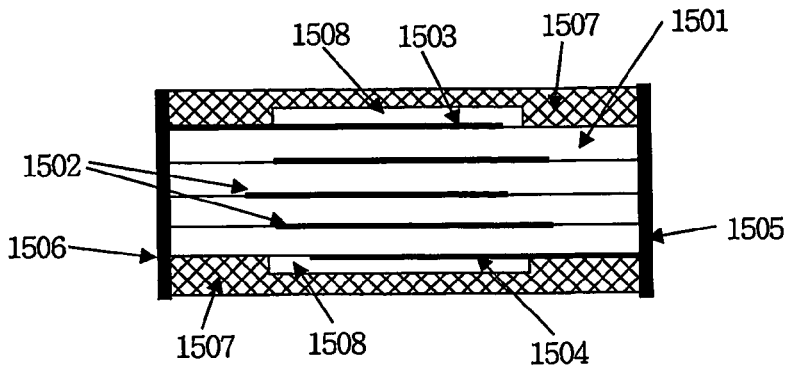
FIGS. 15a and 15b (steps a-c) are a view showing a structure of a resonator according to Embodiment 10 and an explanatory view of a fabricating process thereof.

Referring to FIG. 15a, a resonator according to Embodiment 10 of the present invention will be explained in detail.

The resonator of Embodiment 10 comprises a piezoelectric body 1501 having the piezoelectricity, internal electrodes 1502 formed in the piezoelectric body, an upper electrode 1503 and a lower electrode 1504, which are formed on the upper and lower surfaces of the piezoelectric body, respectively, and to which the electric power is supplied, side electrodes 1505, 1506, which are connected to the upper electrode 1503 and the lower electrode 1504, respectively, and insulators 1507, on which vibration grooves 1508 are formed. The internal electrodes 1502 are not connected to the upper electrode 1503, the lower electrode 1504, and the side electrodes 1505, 1506. Each of the side electrodes 1505, 1506 is formed on each of the opposite sides of the piezoelectric body. The insulators 1507 are formed on the upper and lower portions of the piezoelectric body.

The piezoelectric body is the laminate of the piezoelectric sheets, of which the thickness is controlled up to tens micrometers in order to obtain the high oscillating frequency. The internal electrodes are printed on a partial or near complete surface of the sheets so that the internal electrodes are spaced from the ends of the sheets in order not to be connected to the side, upper and lower electrodes on the piezoelectric sheets. The insulators 1507 formed on the upper and lower portions of the piezoelectric body are only general insulating plates where the vibration grooves 1508 are formed in order for the resonator to vibrate.

The fabricating process of such a resonator will be explained below.

Using the same method as Embodiment 1, piezoelectric green sheets 1509 having desired thickness are fabricated. The plural first piezoelectric sheets 1509 are fabricated by printing the internal electrodes 1502 on the sheets fabricated as above using screen printing so that the internal electrodes are not connected to edges of the sheets. A second piezoelectric sheet 1510 is fabricated by printing the upper electrode 1503 on the upper surface of a piezoelectric sheet so that the upper electrode is connected to the external electrode at only a side edge of the sheet; and a third piezoelectric sheet 1511 is fabricated by printing the lower electrode 1504 on the lower surface of another piezoelectric sheet so that the lower electrode is connected to the external electrode at the other opposite side edge of the sheet. Upper and lower insulating covers 1512, 1513 are fabricated by forming the vibration grooves on the insulating plates having general insulating characteristics.

Figure 15B:
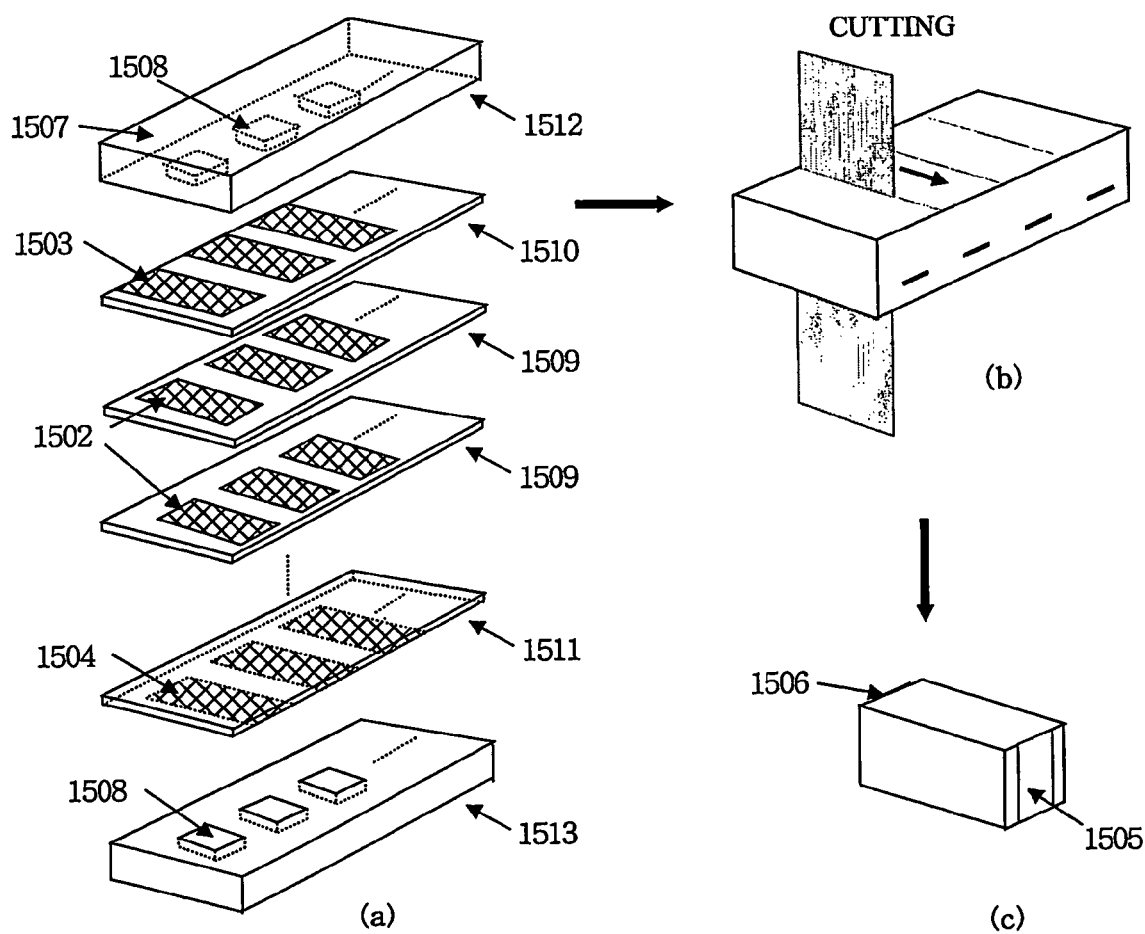

The piezoelectric sheets and the insulating covers fabricated as above are laminated in the order of the lower insulating cover 1513, the third piezoelectric sheet 1511, the plural first piezoelectric sheets 1509, the second piezoelectric sheet 1510, and the upper insulating cover 1512, as shown in FIG. 15b. The laminated element body for a unit element is fabricated by cutting it in unit elements (as indicated by dotted lines). After the laminate is baked out by heating it in order to remove every kind of binder component in the laminate, the laminate is sintered at the proper temperature by increasing the temperature. The element is fabricated by forming the side external electrodes, each of which is connected to each of the upper and lower electrodes of the piezoelectric body, on both surfaces of the laminate including the insulators where the vibration grooves are formed.

The element is fabricated by laminating the insulating covers and the piezoelectric body and simultaneously sintering them. However, the element may be fabricated as a form of a vibrator having insulators for a vibration by bonding the insulating covers and the piezoelectric body, which are separately fabricated. That is, the piezoelectric body is fabricated according to the same method as Embodiment 8. Then, the upper and lower electrodes are formed on the upper and lower surfaces of the sintered piezoelectric body wherein the upper and lower electrodes are not connected to the internal electrodes in the piezoelectric body. The insulating covers, which are fabricated by forming the vibration grooves on the insulating plates having the general insulating characteristics, are provided on the upper and lower portions of the piezoelectric body on which the upper and lower electrodes are formed. The element is fabricated by forming the side external electrodes, each of which is connected to each of the upper and lower electrodes, on both the sides of the piezoelectric body including the insulators.

The resonator with such a structure can be caused to obtain the high oscillating frequency corresponding to the thickness of the piezoelectric sheets by forming the internal electrodes on the thin piezoelectric sheets. Also, since the elements with the desired thickness can be obtained by laminating the piezoelectric sheets, workability is improved. Thus, the elements are easily fabricated.

Embodiment 11

Figure 16A:
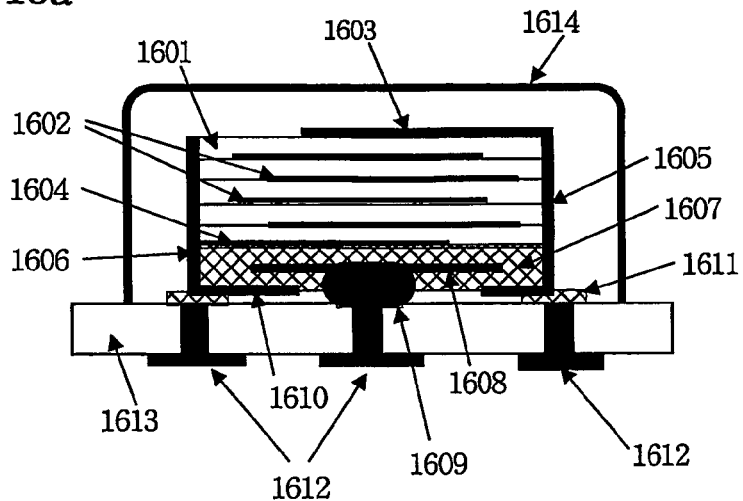
FIGS. 16a and 16b (steps a-c) are a view showing a structure of a resonator according to Embodiment 11 and an explanatory view of a fabricating process thereof.
Figure 16B:
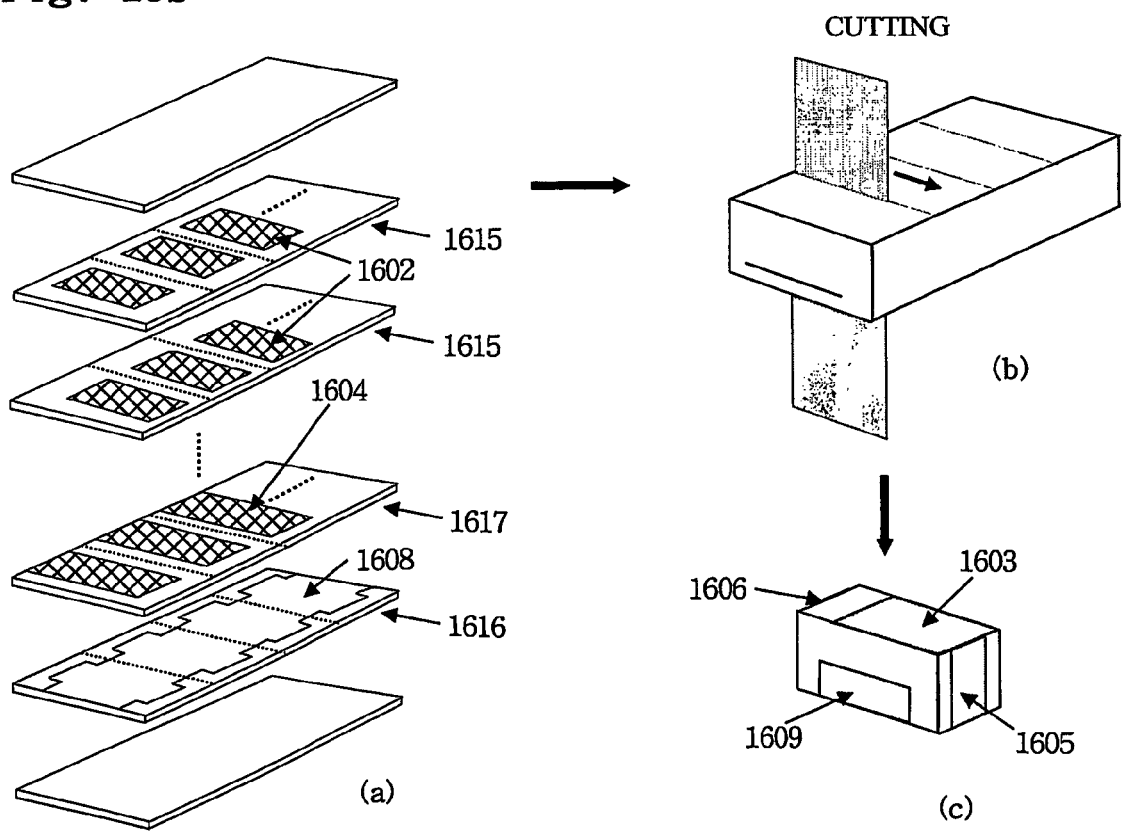

A resonator with built-in capacitor according to the present embodiment shown in FIGS. 16a and 16b comprises a piezoelectric resonator portion and a capacitor portion. The piezoelectric resonator portion comprises piezoelectric body 1601 having the piezoelectricity, internal electrodes 1602 formed in the piezoelectric body, an upper electrode 1603 and a lower electrode 1604, which are formed on the upper and lower surfaces of the piezoelectric body, respectively, and to which the electric power is supplied, and first and second side electrodes 1605, 1606, which are connected to the upper electrode 1603 and the lower electrode 1604, respectively. The internal electrodes 1602 are not connected to the upper electrode 1603, the lower electrode 1604, and the side electrodes 1605, 1606. The first and second side electrodes 1605, 1606 are formed on both the opposite sides of the piezoelectric body, respectively.

The capacitor portion comprises a dielectric body 1607, a capacitor side external electrode 1609, a capacitor internal electrode 1608, and dielectric lower external electrodes 1610. The capacitor internal electrode 1608 is formed in the dielectric body and is connected to the capacitor side external electrode 1609 through the front side surface of the laminated body. The dielectric lower external electrodes 1610 are formed on the lower portion of the dielectric body and insulated from the capacitor side external electrode. The upper electrode of the resonator portion and one of the lower external electrodes of the capacitor portion are connected to one of the external terminals 1612 through one of the side electrodes of the laminated body. The lower electrode 1604 of the resonator portion (that is, the upper electrode of the capacitor portion) and the other lower external electrode of the capacitor portion are connected to another external terminal through the other side electrode of the laminated body. The internal electrode of the capacitor portion is connected to the other external terminal 1612 through the capacitor side external electrode 1609.

The piezoelectric resonator portion is the laminate of the thin piezoelectric sheets, of which the thickness is controlled up to tens micrometers in order to achieve the desired high oscillating frequency. The internal electrodes of the piezoelectric resonator portion are printed on a partial or near complete surface of the sheets so that the internal electrodes are spaced from the edges of the sheets in order not to be connected to the side, upper and lower external electrodes on the thin piezoelectric sheets. The capacitor portion is the laminate of the dielectric sheets which controls a capacitance by controlling the number of the laminated thin dielectric sheets in order to achieve a desired capacitance. The internal electrodes of the capacitor portion are printed on the insulating sheets with conductive paste in order to be connected to the external terminals through the capacitor side external electrodes The piezoelectric resonator portion and the capacitor portion are laminated and then fabricated in the same process. Otherwise, they may be separately fabricated, and then combined. That is, a piezoelectric resonator and a capacitor may be bonded after they are separately fabricated.

An insulating substrate 1613 is provided on the lower portion of the resonator with built-in capacitor. By forming the through-holes at the positions where each through-hole contacts with each of the external electrodes of the resonator with built-in capacitor in order to form three external terminals 1612, the insulating substrate 1613 is provided with the external terminals formed in the through-holes. Three external terminals are connected to the respective external electrodes by conductive adhesive 1611. The resonator with built-in capacitor, in which all of the electrodes are formed, is protected by being enclosed with the metal cap for protecting elements.

The fabricating process of such a resonator with built-in capacitor will be explained below.

Using the same method as Embodiment 1, piezoelectric green sheets 1615 having the desired thickness are fabricated. The internal electrodes 1602 are printed on the sheets fabricated as above using screen printing so that the internal electrodes are not connected to edges of the sheets. In such a case, the spaced distance between the internal electrode 1602 and an edge of the sheets may be different from that between the internal electrode 1602 and the other opposite edge of the sheets.

Using the dielectric raw material powder, which is available for industrial use, the raw material powder having the desired dielectric composition is provided. In order to prepare dielectric green sheets, slurry is produced by adding the binder to the provided dielectric ceramic powder and by using general slurry fabricating method. Dielectric sheets 1616, 1617 having the desired thickness are fabricated of the slurry by using the doctor blade or the like.

A first dielectric sheet 1616 is fabricated by printing an internal electrode 1608 on the dielectric sheet fabricated as above with conductive paste so that the internal electrode is connected to the external electrode at the front side of the element body. A second sheet 1617 is fabricated by printing the upper electrode 1604 (that is, the lower electrode of the resonator portion) on an insulating sheet fabricated as above so that the upper electrode is connected to the external electrode at one of both the sides of the element body.

After the desired number of the first dielectric sheets 1616 and the second dielectric sheets 1617 are laminated, the desired number of the piezoelectric sheets 1615 on which the resonator internal electrodes are printed are alternatively laminated so that the spaced distance between the internal electrode and the first side electrode 165 is alternatively different from that between the internal electrode and the second side electrode 1606. Thereafter, the laminated element for a unit element is fabricated by cutting it in unit elements (as indicated by dotted lines). After the laminated element is baked out by heating it in order to remove every kind of the binder components in the laminated element, the laminated element is sintered at the proper sintering temperature by increasing the temperature.

In addition to the method for simultaneously sintering the laminate, the resonator with built-in capacitor may be fabricated by bonding the resonator portion and the capacitor portion, wherein the resonator portion and the capacitor portion are fabricated by laminating and sintering them separately according to the resonator fabricating method of Embodiment 8 and a general laminated capacitor fabricating method.

The upper electrode 1603 and the lower electrodes 1610, which are not connected to the internal electrodes of the laminate, are formed outside the laminated element, i.e., the resonator with built-in capacitor fabricated according to the respective methods described as above. The upper electrode 1603 is formed to be connected to one of both the sides of the laminate, and the lower electrode 1610 are formed to be connected to both the sides of the laminate and to be insulated in the middle thereof. The first side electrode 1605, which is connected to the upper electrode 1603 of the resonator portion and one of the lower electrodes of the capacitor portion, is formed at a side of the laminates element where the upper and lower electrodes are formed. The second side electrode 1606, which is connected to the lower electrode 1604 of the resonator portion (that is, the upper electrode of the capacitor portion) and the other one of the lower electrodes of the capacitor portion, is formed at the other side of the laminated element. The capacitor side external electrode 1609 (that is, the third side external electrode) connected to the internal electrode of the capacitor portion is formed on the front side of the laminated element. The polling process is performed by applying the electric power to both the external electrodes of the integrated and laminated element where the electrodes are formed, so that the piezoelectric dipole is oriented. In the case that the integrated and laminated element is fabricated by bonding the respective elements, which are separately fabricated, the resonator portion and the capacitor portion may be bonded after the resonator portion is polled.

The laminated element fabricated as above is positioned on the insulating substrate, wherein the external terminals 1612 are formed in the through-holes for three terminals formed in the insulating substrate. Both the terminals are connected to the respective first and second side external electrodes in both the ends of the laminated element with conductive adhesive 1611. The intermediate external terminal is connected to the third side external electrode in the front side of the laminated element. Finally, the resonator with built-in capacitor is completed by capping the laminated element with the protective metal cap, which is generally available, in order to enclose the resonator with built-in capacitor with the protective cap.

As can be seen from the equivalent circuit of FIG. 8, the completed resonator with built-in capacitor comprises the resonator and the capacitors in a unit chip, which are in the portion drawn by a dotted line, wherein the capacitors are connected to both the ends of the resonator, respectively.

Since the resonator with built-in capacitor having such a structure is provided with the internal electrodes on the thin piezoelectric sheets, the high oscillating frequency corresponding to the thickness of the thin piezoelectric sheets can be achieved. Also, since the elements with the desired thickness can be obtained by laminating the piezoelectric sheets, workability is improved. Thus, the element with various configurations is easily fabricated. Also, since the resonator with built-in capacitor is in the form of a unit chip including capacitors, the simple and minimized single chip element, which works stably, can be fabricated by the simple fabricating method, and easily applied to a compact electronic device.

Embodiment 12

Figure 17:
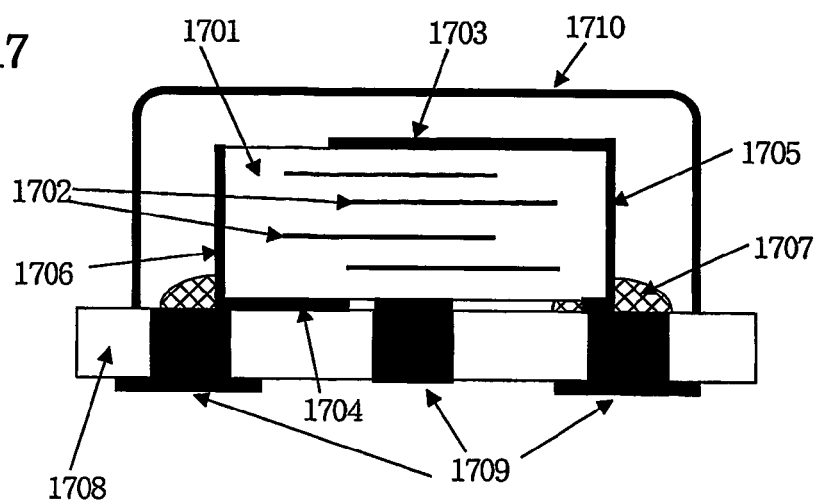
FIG. 17 is a view showing a structure of a resonator according to Embodiment 12.

Referring to FIG. 17, a resonator with built-in capacitor according to Embodiment 12 of the present invention will be explained in detail.

The resonator with built-in capacitor according to the present embodiment shown in FIG. 17 comprises a piezoelectric resonator portion and a capacitor portion. The piezoelectric resonator portion comprises piezoelectric body 1701 having the piezoelectricity, internal electrodes 1702 formed in the piezoelectric body, an upper electrode 1703 and a lower electrode 1704, which are formed on the upper and lower portions of the piezoelectric body, respectively, and to which the electric power is supplied, and side electrodes 1705, 1706, which are connected to the upper electrode 1703 and the lower electrode 1704, respectively. The internal electrodes 1702 are not connected to the upper electrode 1703, the lower electrode 1704, and the side electrodes 1705, 1706. The side electrodes 1705, 1706 are formed on both the opposite sides of the piezoelectric body, respectively.

The capacitor portion comprises a dielectric body 1708, and capacitor terminal electrodes 1709 (that is, external terminals) in through-holes of the dielectric body. The terminal electrodes (that is, external terminal) are connected to the upper, lower and side electrodes of the piezoelectric resonator body with conductive adhesive 1707.

The piezoelectric resonator portion is the laminate of the thin piezoelectric sheets, of which the thickness is controlled up to tens micrometers in order to achieve the desired high oscillating frequency. The internal electrodes of the piezoelectric resonator portion are printed on a partial or near complete surface of the sheets so that the internal electrodes are spaced from the edges of the sheets in order not to be connected to the side, upper and lower external electrodes on the thin piezoelectric sheets. Since the capacitor portion is the dielectric substrate having three through-holes, which pass through the substrate, and in which the terminal electrodes are formed, two capacitors are separately connected to the respective terminals of the resonator. The resonator with built-in capacitor where all of the electrodes are formed are enclosed and protected by the protective metal cap.

The fabricating process of such a resonator with built-in capacitor will be explained below.

Using the same method as Embodiment 1, the laminated piezoelectric body is fabricated. The upper electrode and the lower electrode, which are not connected to the internal electrodes of the laminate, are formed outside the laminate. The side electrodes, which are connected to the upper and lower electrodes, respectively, are formed on both the sides of the piezoelectric body. The polling process is performed by applying the electric power to both the external electrodes of the piezoelectric body where the electrodes are formed, so that piezoelectric dipole is oriented. The piezoelectric body fabricated as above is positioned on the dielectric substrate, wherein the capacitor terminal electrodes (that is, the external terminals) are formed in the through-holes for three terminals formed in the dielectric substrate. Both the terminal electrodes of the dielectric substrate are connected to the respective side external electrodes in both the ends of the laminated element, with conductive adhesive 1611. The resonator element is completed by capping the piezoelectric body using the protective metal cap, which is generally available, in order to enclose the piezoelectric body with the protective cap.

As can be seen from the equivalent circuit of FIG. 8, the completed resonator with built-in capacitor comprises the resonator and the capacitors in a unit chip, which are in the portion drawn by a dotted line, wherein the capacitors are connected to both the ends of the resonator, respectively.

Since the resonator with built-in capacitor having such a structure is provided with the internal electrodes on the thin piezoelectric sheets, the high oscillating frequency corresponding to the thickness of the thin piezoelectric sheets can be achieved. Also, since the element with the desired thickness can be obtained by laminating the piezoelectric sheets, workability is improved. Thus, the element with various configurations is easily fabricated. Also, since the dielectric provided on the lower portion of the piezoelectric body functions as a capacitor and a substrate, the capacitors are easily included in a unit element. Thus, the simple and minimized single chip element can be fabricated, and easily applied to a compact electronic device.

Embodiment 13

Figure 18:
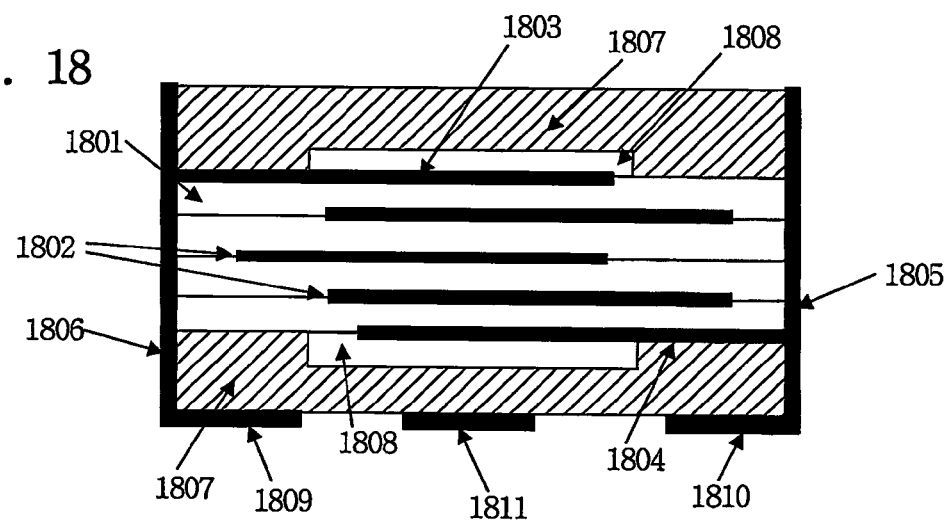
FIG. 18 is a view showing a structure of a resonator according to Embodiment 13.

Referring to FIG. 18, a resonator with built-in capacitor according to Embodiment 13 of the present invention will be explained in detail.

The resonator with built-in capacitor according to the present embodiment shown in FIG. 18 comprises a piezoelectric resonator portion and a capacitor portion. The piezoelectric resonator portion comprises piezoelectric body 1801 having the piezoelectricity, internal electrodes 1802 formed in the piezoelectric body, an upper electrode 1803 and a lower electrode 1804, which are formed on the upper and lower portions of the piezoelectric body, respectively, and to which the electric power is supplied, and side electrodes 1805, 1806, which are connected to the upper electrode 1803 and the lower electrode 1804, respectively. The internal electrodes 1802 are not connected to the upper electrode 1803, the lower electrode 1804, and the side electrodes 1805, 1806. The side electrodes 1805, 1806 are formed on both the opposite sides of the piezoelectric body, respectively. The capacitor portion comprises a dielectric body 1807, first and second surface external electrodes 1809, 1810, which are formed on a surface of the dielectric body and connected to the side external electrodes, and a third surface external electrode 1811, which is formed on the surface of the dielectric body and insulated from the side external electrodes.

The piezoelectric resonator portion is provided with plate type dielectrics, each of which has vibration groove 1808, on the upper and lower portions of the piezoelectric resonator portion. One dielectric (that is, a capacitor portion) of the upper and lower dielectrics is provided with the surface external electrodes as described above. The piezoelectric resonator portion is the laminate of thin piezoelectric sheets, of which the thickness is controlled up to tens micrometers in order to achieve the desired high oscillating frequency. The internal electrodes of the piezoelectric resonator portion are printed on a partial or near complete surface of the sheets so that the internal electrodes are spaced from the edges of the sheets in order not to be connected to the side, upper and lower external electrodes on the thin piezoelectric sheets. The capacitor portion is the structure that three surface external electrodes are printed on surfaces of the dielectrics, where the vibration grooves 1808 are formed, with conductive paste in order to be connected to the respective external terminals.

The fabricating process of such a resonator with built-in capacitor will be explained below.

Using the same method as Embodiment 10, the laminated piezoelectric body is fabricated. The upper electrode and the lower electrode, which are not connected to the internal electrodes of the laminate, are formed outside the laminate. Then, the plate type dielectric covers, each of which the vibration groove 1808 is formed on, are installed on the upper and lower portions of the laminated piezoelectric body. The first and second surface external electrodes 1809, 1810, each of which is connected to each of the side electrodes at both the ends of one of the upper and lower dielectrics. The third surface external electrode 1811 is formed to be insulated from the side electrodes in the middle thereof. The side electrode 1806 connected to the upper electrode 1803 of the piezoelectric body and the first surface external electrode 1809, and the side electrode 1805 connected to the lower electrode 1804 of the piezoelectric body and the second surface external electrode 1810, are formed on each of the opposite sides of the laminate where the electrodes are formed. Then, the polling process is performed by applying the electric power to both the side electrodes of the laminate, so that the piezoelectric dipole is oriented.

As can be seen from the equivalent circuit of FIG. 8, the completed resonator with built-in capacitor comprises the resonator and the capacitors in a unit chip, which are in the portion drawn by a dotted line, wherein the capacitors are connected to both the ends of the resonator, respectively.

Since the resonator with built-in capacitor having such a structure is provided with the internal electrodes on the thin piezoelectric sheets, the high oscillating frequency corresponding to the thickness of the thin piezoelectric sheets can be achieved. Also, since the element with the desired thickness can be obtained by laminating the piezoelectric sheets, workability is improved. Thus, the element with various configurations is easily fabricated. Also, since the resonator with built-in capacitor includes the dielectric covers, in which the vibration grooves are formed, and which function as capacitors, the capacitors are included in the unit element. Thus, the simple and minimized single chip element can be fabricated, and easily applied to the compact electronic device.

Embodiment 14

Figure 19:
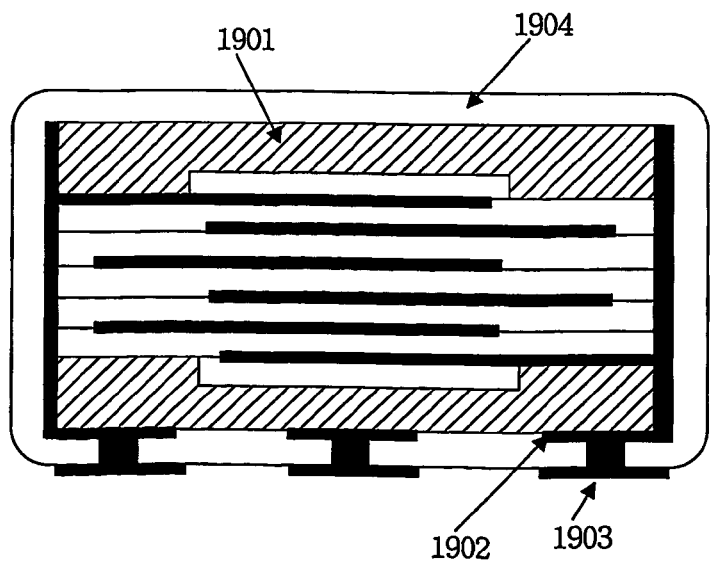
FIG. 19 is a view showing a structure of a resonator according to Embodiment 14.

The unit elements fabricated according to the respective embodiments may be capped by enclosing the elements with insulating epoxy in addition to the protective cap in order to protect the elements. Referring to FIG. 19, a three-terminal type element, as an example of the present embodiment, wherein the entire element is capped and enclosed with the insulating epoxy, will be explained in detail.

Using the same method as Embodiment 13, unit element body 1901, where external electrodes are formed, is fabricated. An external terminal 1903 connected to a surface external electrode 1902 formed on an end of the surface of the body, is formed. The element is completed by molding the body, where the external electrodes are formed, with elastic insulating epoxy 1904 in order to form a protective film. The protective epoxy film may be used for capping a two-terminal type element in addition to the three-terminal type element as described above.

In the meantime, the process for fabricating the vibrator as described above can make the high frequency chip elements be fabricated by designing the internal electrodes to be insulated in the various elements, which requires the high oscillating frequency, in addition to the resonators as described above.

Since the workability of the vibrator as described above is improved, the vibrator can be fabricated in the various configurations in addition to these described above. Also, the vibrator as described above may be easily fabricated as a combined chip, which is fabricated by bonding two or more elements according to desired characteristics.

By applying the process for fabricating the vibrators of the present invention as described above to various elements, which requires high oscillating frequency in addition to the resonator described above, the high frequency chip elements can be fabricated. Since the vibrator of the present invention is improved in the workability, the vibrator can be fabricated in the various configurations in addition to these described above. Also, the vibrator as described above may be easily fabricated as a combined chip, which is fabricated by bonding two or more elements according to desired characteristics.

As described above, the vibrator can obtain the high oscillating frequency stably by simultaneously sintering the laminated element body, which is fabricated by laminating the cover layers, where the vibration grooves are formed, on the thin piezoelectric sheets, of which the thickness is controlled. Since the number of steps of the fabricating process decreases due to the simultaneous sintering, the light, and compact chip vibrator realizing the desired electrical characteristics, can be fabricated, by the simplified process. Also, since the vibrator is fabricated by laminating the thin piezoelectric sheets, of which the thickness is controlled, and forming the internal electrodes between the sheets in order not to be connected to the external electrodes of the element, the vibrator can obtain the desired high oscillating frequency stably as well as the desired thickness.

Further, since the workability is improved in fabricating the chip element by controlling the thickness of the element easily, the vibrator can be fabricated in the various configurations. As described above, the compact chip vibrator realizing the desired electrical characteristics according to the present invention causes the number of the fabricating steps to decrease and can be fabricated by the simplified process, so that the productivity is improved, and the costs decrease.

The resonator with built-in capacitor fabricated according to the present invention can obtain the stable oscillating characteristics and the easily controlled frequency by fabricating the single chip, wherein the capacitors are bonded to the resonator. The resonator with built-in capacitor fabricated according to the present invention can easily be fabricated, obtain the desired oscillating frequency by controlling the thickness of the piezoelectric sheets where the internal electrodes are formed, have the easily controlled capacitance by controlling the number of the laminated dielectric sheets and the thickness of the dielectric sheet, and are fabricated by bonding the capacitors with various configurations to the resonator.

Also, the resonator with built-in capacitor according to the present invention can be fabricated as a compact single chip with various configurations and without any additional process.

What is claimed is:

1. A vibrator comprising;
   a piezoelectric sheet;
   internal electrodes formed on both sides of the piezoelectric sheet;
   cover layers formed on both sides of the piezoelectric sheet including the internal electrodes formed thereon;
   external electrodes connected to the corresponding internal electrodes; and
   vibration grooves disposed on a portion of the respective internal electrodes, wherein the piezoelectric sheet is fabricated by forming a sheet of slurry, and the vibrator is fabricated by simultaneously sintering the piezoelectric sheet and the cover layers, and each of the cover layers is formed with a burning passage communicating with the vibration groove.

2. The vibrator according to claim 1, wherein the vibration grooves are disposed in the cover layers.

3. The vibrator according to claim 1, wherein the vibration grooves are disposed between the piezoelectric sheet and the cover layers.

4. The vibrator according to claim 1, further comprising first and second surface external electrodes, which are formed on a surface of said cover layer, and each of which is connected to each of the external electrodes, and a third surface external electrode, which is formed in the middle of the surface of said cover layer, and which is not connected to the external electrodes, wherein the extreme outer cover layers of the vibrator are dielectrics.

5. The vibrator according to claim 1, further comprising at least one dielectric sheet, in which internal electrodes are formed, wherein said dielectric sheet is laminated and combined on the upper portion and/or the lower portion of the vibrator.

6. The vibrator according to claim 5, wherein the vibrator is three-terminal type, that is, said external electrodes are connected to the internal electrodes of the piezoelectric portion and a capacitor portion in both ends and in the middle of the vibrator, respectively.

7. The vibrator according to claim 1, wherein at least one of the cover layers comprises a first cover layer provided with a through-hole for the vibration groove and a second cover layer covering the through-hole.

8. The vibrator according to claim 1, wherein the burning passage is filled with epoxy.

* * * * *